(12) United States Patent  (10) Patent No.: US 7,816,641 B2
Tay et al.  (45) Date of Patent: Oct. 19, 2010

(54) LIGHT GUIDE ARRAY FOR AN IMAGE SENSOR

(75) Inventors: Hiok-Nam Tay, Singapore (SG); Thanh-Trung Do, Singapore (SG)

(73) Assignee: Candela Microsystems (S) Pte. Ltd., Singapore (SG)

( * ) Notice: Subject to any disclaimer, the term of this patent is extended or adjusted under 35 U.S.C. 154(b) by 0 days.

(21) Appl. No.: 12/218,749

(22) Filed: Jul. 16, 2008

(65) Prior Publication Data

US 2009/0166518 A1   Jul. 2, 2009

Related U.S. Application Data

(60) Provisional application No. 61/009,454, filed on Dec. 28, 2007, provisional application No. 61/062,773, filed on Jan. 28, 2008, provisional application No. 61/063,301, filed on Feb. 1, 2008, provisional application No. 61/069,344, filed on Mar. 14, 2008.

(51) Int. Cl.
*H04N 5/335* (2006.01)
(52) U.S. Cl. .................. 250/226; 348/272; 257/432; 257/291
(58) Field of Classification Search .............. 250/226; 257/432, 290–294; 348/272
See application file for complete search history.

(56) References Cited

U.S. PATENT DOCUMENTS

| 5,952,645 | A | 9/1999 | Wang |
| 6,066,511 | A | 5/2000 | Fukusho |
| 6,566,151 | B2 | 5/2003 | Yeh |
| 6,577,342 | B1 | 6/2003 | Wester |
| 6,858,828 | B2 | 2/2005 | Roy |
| 7,001,795 | B2 | 2/2006 | Jiang |
| 7,078,779 | B2 * | 7/2006 | Wang et al. ................. 257/432 |
| 7,119,319 | B2 | 10/2006 | Noto |
| 7,265,328 | B2 | 9/2007 | Mouli |
| 7,326,588 | B2 | 2/2008 | Yaung |
| 7,358,103 | B2 | 4/2008 | Li |
| 2004/0227170 | A1 | 11/2004 | Jiang |
| 2005/0139750 | A1 | 6/2005 | Dobashi |

(Continued)

FOREIGN PATENT DOCUMENTS

EP  1439582 A2  7/2004

(Continued)

OTHER PUBLICATIONS

PCT/US2008/088077, International Search Report & Written Opinion.

(Continued)

*Primary Examiner*—Tony Ko
(74) *Attorney, Agent, or Firm*—Irell & Manella, LLP.; Ben Yorks

(57) ABSTRACT

An image sensor pixel that includes a photoelectric conversion unit supported by a substrate and an insulator adjacent to the substrate. The pixel includes a light guide that is located within an opening of the insulator and extends above the insulator such that a portion of the light guide has an air interface. The air interface improves the internal reflection of the light guide. Additionally, the light guide and an adjacent color filter are constructed with a process that optimizes the upper aperture of the light guide. These characteristics of the light guide eliminate the need for a microlens.

12 Claims, 23 Drawing Sheets

U.S. PATENT DOCUMENTS

| | | |
|---|---|---|
| 2006/0158547 A1 | 7/2006 | Komatsu et al. |
| 2007/0158772 A1 | 7/2007 | Boettiger |
| 2008/0049126 A1* | 2/2008 | Ford et al. .................. 348/294 |

FOREIGN PATENT DOCUMENTS

| | | |
|---|---|---|
| EP | 1758372 A1 | 2/2007 |
| EP | 1793247 A1 | 6/2007 |
| JP | 06-169075 A | 6/1994 |
| JP | 06224398 | 8/1994 |
| JP | 10-154805 | 6/1998 |
| JP | 2001-237405 A | 8/2001 |
| JP | 2007-150087 A | 6/2007 |
| JP | 2009-88415 A | 4/2009 |
| WO | WO9946618 A1 | 9/1999 |

OTHER PUBLICATIONS

Kataoka, Dry Etching Characteristics of Si-based Materials Using CF4/02 Atmospheric Pressure Glow Discharge Plasma, Jpn. J. Appl. Phys., Jan. 2000, pp. 294-298, vol. 39 Part 1 No. 1, Publication Board, Japan Journal of Applied Physics, Japan.

Kim, Etching of oxynitride thin films using inductively coupled plasma, J. Vac. Sci. Technol. A, May/Jun. 2005, pp. 520-524, vol. 23, issue 3, American Vacuum Society, USA.

* cited by examiner

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 21% | 26% | 31% | 35% | 40% | 44% | 48% |
| 2.2 | 17% | 21% | 25% | 29% | 33% | 37% | 40% |
| 2.8 | 14% | 17% | 20% | 23% | 27% | 30% | 33% |
| 4 | 10% | 12% | 14% | 17% | 19% | 21% | 23% |
| 5.6 | 7.0% | 8.7% | 10% | 12% | 14% | 15% | 17% |

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 2.5% | 2.1% | 4.0% | 7.0% | 12% | 17% | 22% |

| pitch (um) | gap width (um) | | | | | | |
|---|---|---|---|---|---|---|---|
| | 0.2 | 0.25 | 0.3 | 0.35 | 0.4 | 0.45 | 0.5 |
| 1.8 | 0.52% | 0.54% | 1.2% | 2.5% | 4.6% | 7.2% | 10.3% |
| 2.2 | 0.43% | 0.45% | 1.0% | 2.1% | 3.8% | 6.1% | 8.7% |
| 2.8 | 0.34% | 0.36% | 0.81% | 1.6% | 3.1% | 4.9% | 7.0% |
| 4 | 0.24% | 0.25% | 0.58% | 1.2% | 2.2% | 3.5% | 5.0% |
| 5.6 | 0.18% | 0.18% | 0.42% | 0.85% | 1.6% | 2.5% | 3.7% |

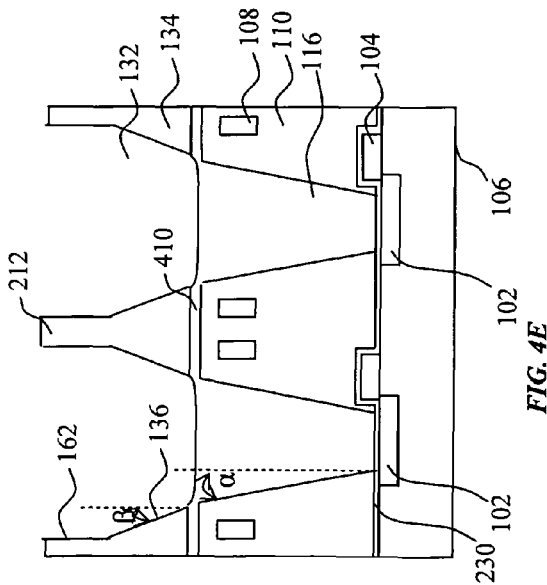
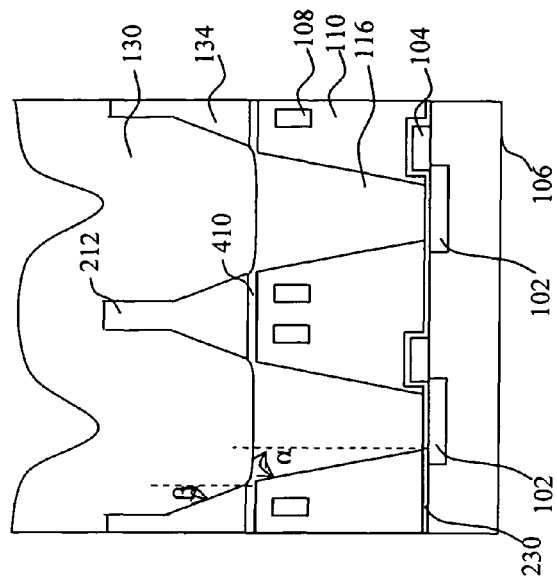
FIG. 4E
FIG. 4F
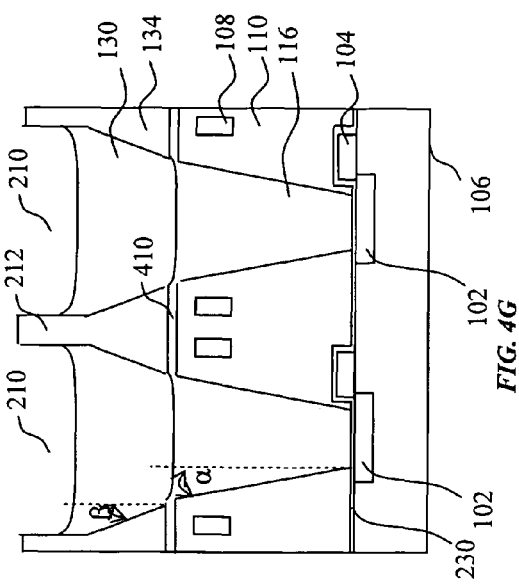
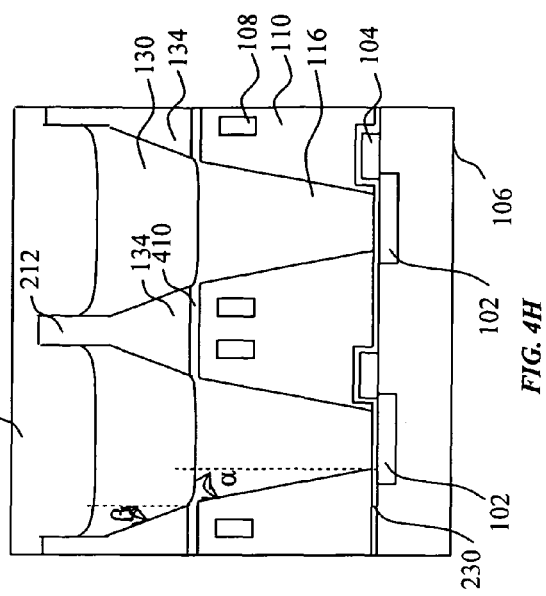
FIG. 4G
FIG. 4H

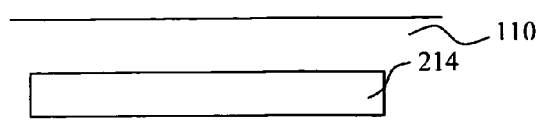
*FIG. 10A*    *FIG. 10B*
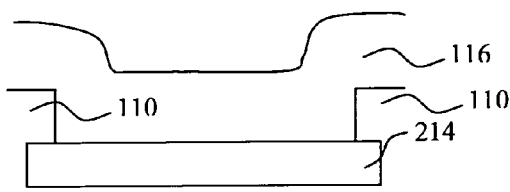
*FIG. 10C*    *FIG. 10D*
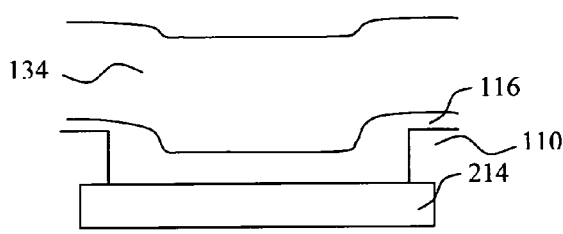
*FIG. 10E*    *FIG. 10F*
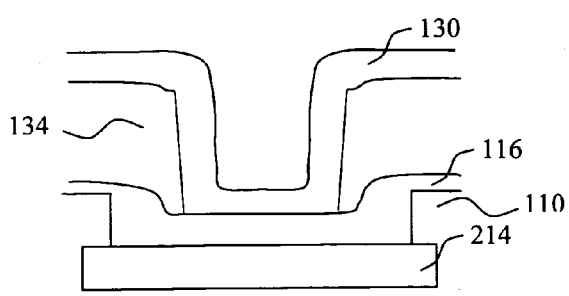
*FIG. 10G*    *FIG. 10H*

LIGHT GUIDE ARRAY FOR AN IMAGE SENSOR

REFERENCE TO CROSS-RELATED APPLICATIONS

This application claims priority to Application No. 61/009,454 filed on Dec. 28, 2007; Application No. 61/062,773 filed on Jan. 28, 2008; Application No. 61/063,301 filed on Feb. 1, 2008 and Application No. 61/069,344 filed on Mar. 14, 2008.

BACKGROUND OF THE INVENTION

1. Field of the Invention

The subject matter disclosed, generally relates to structures and methods for fabricating solid state image sensors.

2. Background Information

Photographic equipment such as digital cameras and digital camcorders may contain electronic image sensors that capture light for processing into still or video images. Electronic image sensors typically contain millions of light capturing elements such as photodiodes.

Solid state image sensors can be either of the charge coupled device (CCD) type or the complimentary metal oxide semiconductor (CMOS) type. In either type of image sensor, photo sensors are formed in a substrate and arranged in a two-dimensional array. Image sensors typically contain millions of pixels to provide a high-resolution image.

FIG. 1A shows a sectional view of a prior art solid-state image sensor 1 showing adjacent pixels in a CMOS type sensor, reproduced from U.S. Pat. No. 7,119,319. Each pixel has a photoelectric conversion unit 2. Each conversion unit 2 is located adjacent to a transfer electrode 3 that transfers charges to a floating diffusion unit (not shown). The structure includes wires 4 embedded in an insulating layer 5. The sensor typically includes a flattening layer 6 that compensates for top surface irregularities due to the wires 4.

Light guides 7 are integrated into the sensor to guide light onto the conversion units 2. The light guides 7 are formed of a material such as silicon nitride that has a higher index of refraction than the insulating layer 5. Each light guide 7 has an entrance that is wider than the area adjacent to the conversion units 2. The sensor 1 may also have a color filter 8 and a microlens 9.

The microlens 9 focuses the light 7 onto the photo photoelectric conversion units 2. As shown in FIG. 1B because of diffraction optics, the microlens 9 can cause diffracted light that propagates to nearby photoelectric conversion units and create optical crosstalk and light loss. The amount of crosstalk increases when there is a flattening layer because the lens is farther away from the light guide. Metal shields are sometimes integrated into the pixels to block cross-talking light. The formation, size, and shape of the microlens can be varied to reduce crosstalk. However, extra cost must be added to the precise microlens forming process, and crosstalk still cannot be eliminated.

As shown in FIG. 1A, the light guide is in direct contact with the silicon. This interface can cause undesirable backward reflection away from the sensor. Conventional anti-reflection structures for image sensors include the insertion of a nitride or oxynitride layer only solve reflection problem between the silicon and a thick oxide insulator. This approach is not applicable when the interface is silicon and nitride.

BRIEF SUMMARY OF THE INVENTION

An image sensor pixel that includes a photoelectric conversion unit supported by a substrate and an insulator adjacent to the substrate. The pixel may have a plurality of cascaded light guides, wherein a portion of the cascaded lights guides is within the insulator and another portion extends above the insulator.

BRIEF DESCRIPTION OF THE DRAWINGS

FIGS. 4A-L are illustrations showing a process used to fabricate the pixels shown in FIG. 3;

FIGS. 10A-H are illustrations showing a process to expose a bond pad;

DETAILED DESCRIPTION

Figure 1A:
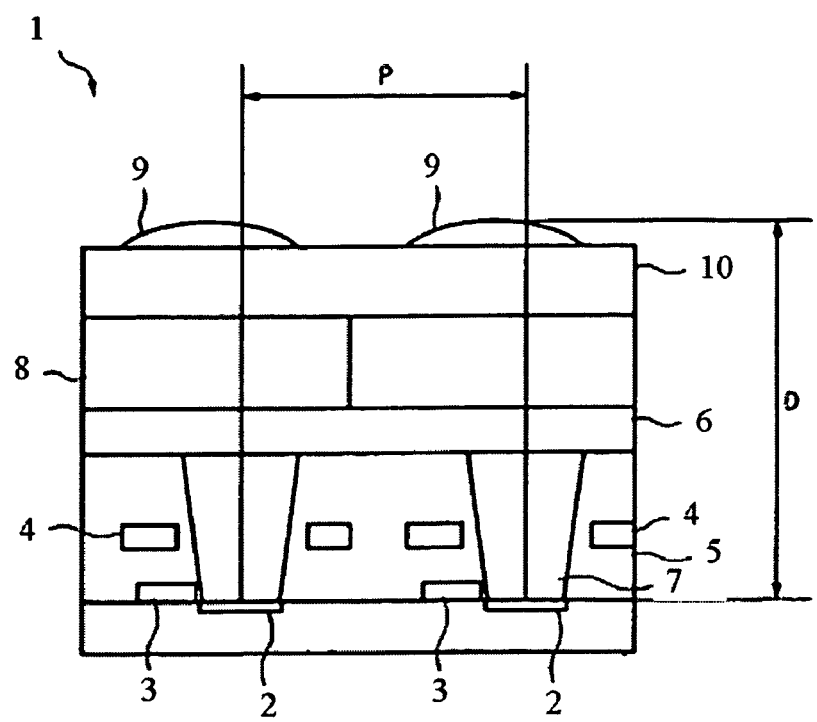
FIG. 1A is an illustration showing a cross-section of two image sensor pixels of the prior art.
Figure 1B:
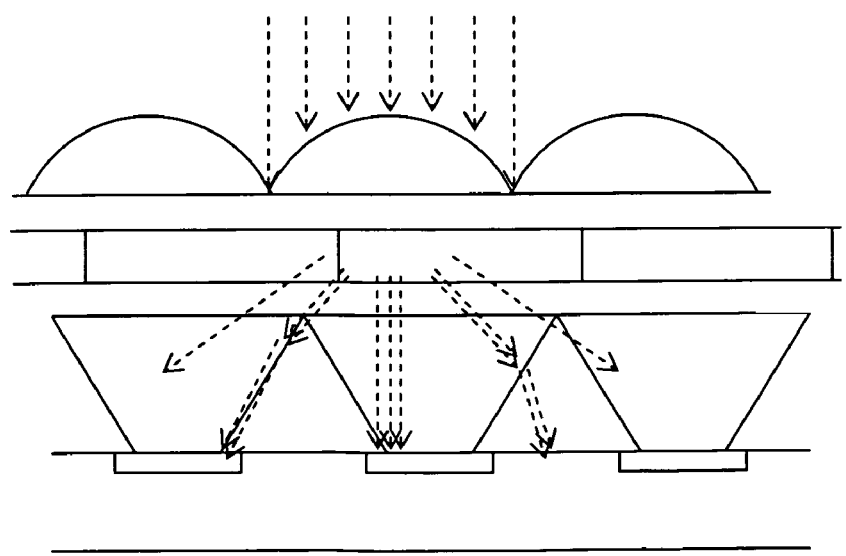
FIG. 1B is an illustration showing light cross-talk between adjacent pixels of the prior art.

Disclosed is an image sensor pixel that includes a photoelectric conversion unit supported by a substrate and an insulator adjacent to the substrate. The pixel includes a light guide that is located within an opening of the insulator and extends above the insulator such that a portion of the light guide has an air interface. The air interface improves the internal reflection of the light guide. Additionally, the light guide and an adjacent color filter are constructed with a process that optimizes the upper aperture of the light guide. These characteristics of the light guide eliminate the need for a microlens.

The pixel may include two light guides, one above the other. The first light guide is located within a first opening of the insulator adjacent to the substrate. The second light guide is located within a second opening in a support film, which is eventually removed during fabrication of the pixel. A color filter is located within the same opening and is aligned with the second light guide. The second light guide may be offset from the first light guide at the outer corners of the pixel array to capture light incident at a non-zero angle relative to the vertical axis.

An air gap is created between neighboring color filters by removing the support film material adjacent to the filter. Air has a lower refractive index than the support film and enhances internal reflection within the color filter and the light guide. In addition, the air gap is configured to "bend" light incident on the gap into the color filter and increase the amount of light provided to the sensor.

Reflection at the silicon-light-guide interface is reduced by creating a nitride film and a first oxide film below the first light guide. A second oxide film may be additionally inserted below the nitride film to broaden the range of light frequencies for effective anti-reflection. The first oxide film can be deposited into an etched pit before application of the light-guide material. An alternate embodiment of anti-reflection has all anti-reflection films formed before a pit is etched and an additional light guide etch-stop film above to protect the anti-reflection film from the pit etchant.

Referring to the drawings more particularly by reference numbers, FIGS. 2, 4A-L, 5 and 6A-B show embodiments of two adjacent pixels in an image sensor 100. Each pixel includes a photoelectric conversion 102 that converts photonic energy into electrical charges. The charges are carried by a transfer electrode 104 located adjacent to each conversion unit 102. The electrodes 104 and conversion units 102 are formed on a substrate 106. The sensor 100 also includes wires 108 that are embedded in an insulating layer 110.

Each pixel has a first light guide 116. The first light guides 116 are constructed with a refractive material that has a higher index of refraction than the insulating layer 110. As shown in FIG. 4B, each first light guide 116 may have a sidewall 118 that slopes at an angle α relative to a vertical axis. The angle α is selected to be less than 90–asin ($n_{insulating\ layer}/n_{light\ guide}$), preferably 0, so that there is total internal reflection of light within the guide, wherein $n_{insulating\ layer}$ and $n_{light\ guide}$ are the indices of refraction for the insulating layer material and light guide material, respectively. The light guides 116 internally reflect light from the second light guide 130 to the conversion units 102.

The second light guides 130 are located above first light guides 116 and may be made from the same material as the first light guide 116. The top end of the second light guide 130 is wider than the bottom end, where the second light guide 130 meets the first light guide 116. Thus the gap between adjacent second light guides 130 at the bottom (henceforth "second gap") is larger than at the top, as well as larger than the air gap 422 between the color filters 114B, 114G above the second light guides 130. The second light guides 130 may be offset laterally with respect to the first light guides 116 and/or the conversion unit 102, as shown in FIG. 6A, wherein the centerline C2 of the second light guide 130 is offset from the centerline C1 of the first light guide 116 or of the photoelectric conversion unit 102. The offset may vary depending upon the pixel position within an array. For example, the offset may be greater for pixels located at the outer portion of the array. The offset may be in the same lateral direction as the incident light to optimize reception of light by the first light guide. Offset second light guides 130 capture more light that is incident at a nonzero angle relative to the vertical axis. Effectively second light guide 130 and first light guide 114 together constitute a light guide that takes different shapes at different pixels. The shape is optimized to the incident light ray angle at each pixel.

Figure 5:
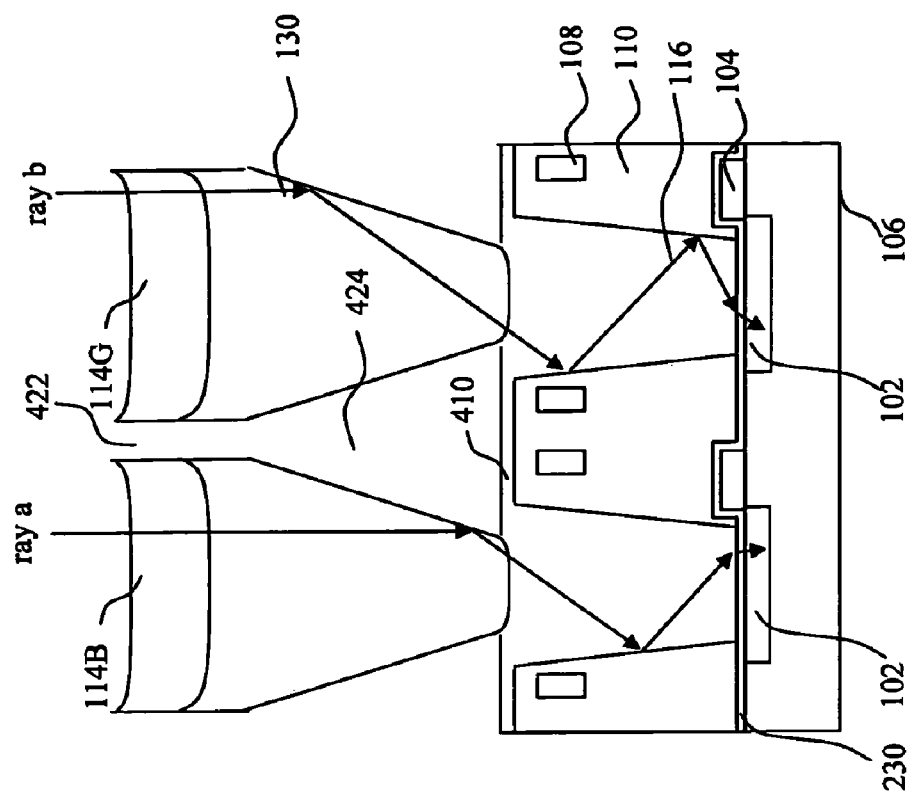
FIG. 5 is an illustration showing ray traces within the pixel of FIG. 2.
Figure 2:
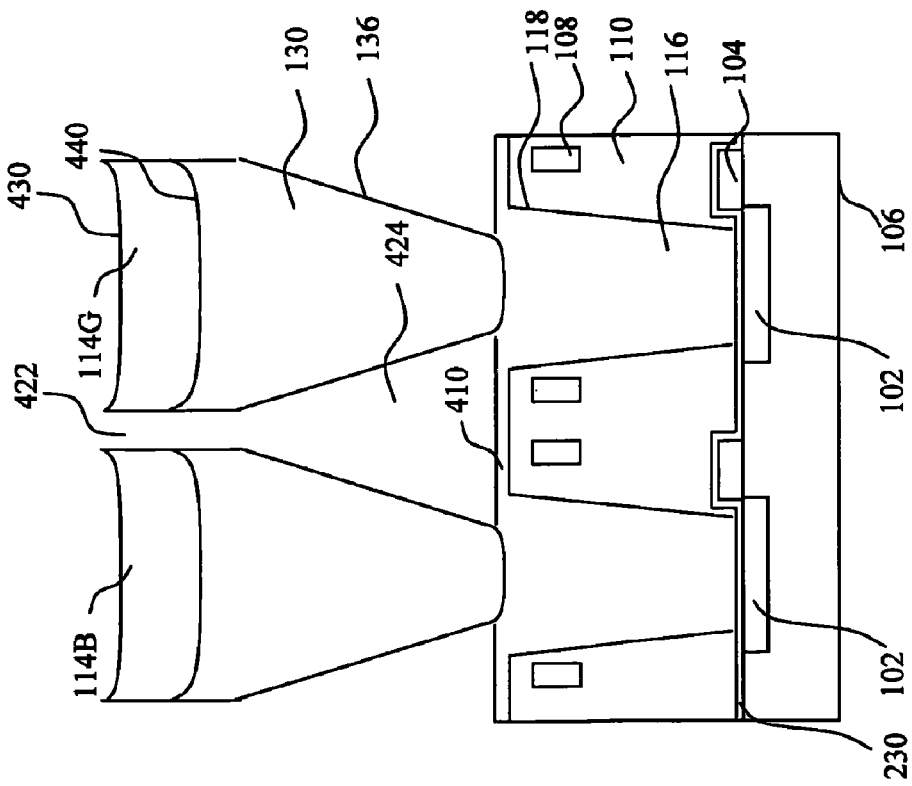
FIG. 2 is an illustration showing a cross-section of two image sensor pixels of the present invention.
Figure 6B:
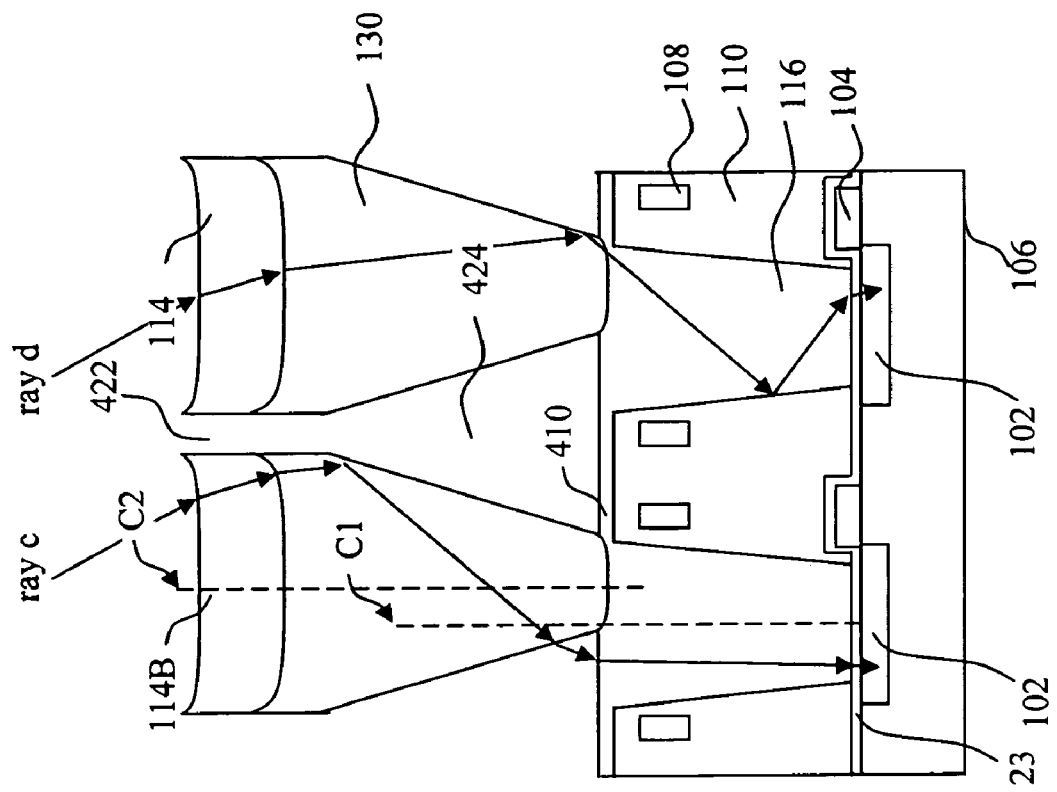
FIG. 6B is an illustration showing light ray traces within the pixel of FIG. 6A.
Figure 6A:
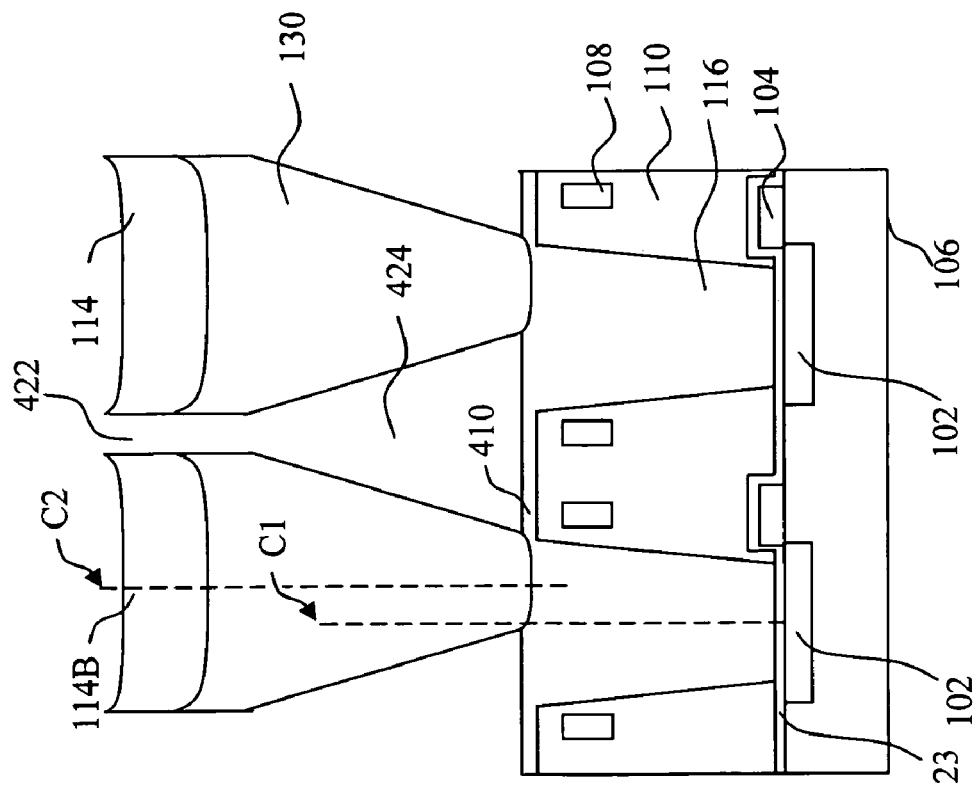
FIG. 6A is an illustration showing a pixel at a corner of the array.

FIGS. 5 and 6B illustrate ray tracing for a pixel at the center of an array and at a corner of the array, respectively. In FIG. 5, incident light rays come in vertically. The second light guides 130 are centered to the first light guides 116. Both light rays a and b reflect once within the second light guide 130 then enter the first light guide 116, reflects once (ray a) or twice (ray b) and then enter conversion units 102. In FIG. 6B, the second light guides 130 are offset to the right, away from the center of the array, which is towards the left. Light ray c, which comes in from the left at an angle up to 25 degrees relative to the vertical axis, reflects off the right sidewall of the second light guide 130, hits and penetrate the lower-left sidewall of the same, enters the first light guide 116, and finally reaches conversion unit 102. The offset is such that the first light guide 116 recaptures the light ray that exits lower-left sidewall of second light guide 130. At each crossing of light guide sidewall, whether exiting the second light guide or entering the first light guide, light ray c refracts in a way that the refracted ray's angle to the vertical axis becomes less each time, enhancing propagation towards the photoelectric conversion unit.

Incorporating two separate lights guides, even if both use the same light guide material, has a second advantage of reducing the etching depth for each light guide. Consequently, slope side wall etching is easier to achieve with higher accuracy. It also makes deposition of lightguide material less likely to cause unwanted keyholes, which often happen when depositing thin film into deep cavities, in this case causing light to scatter from the light guide upon encountering the keyholes.

Color filters 114 are located above the second light guides 130. The sidewall upper portion at and adjacent to the color filters is more vertical than the rest of second lightguide. Viewing it another way, sidewalls of adjacent color filters facing each other are essentially parallel.

There is a first air-gap 422 between the color filters having a width of 0.45 um or less. The depth of the first air-gap 422 is equal to 0.6 um or greater. The first air-gap has a width of preferably 0.45 um or less. An air gap with the dimensional limitations cited above causes the light within the gap to be diverted into the color filters and eventually to the sensors. Thus the percentage loss of light impinging on the pixel due to passing through the gap (henceforth "pixel loss") is substantially reduced.

Figure 3A:
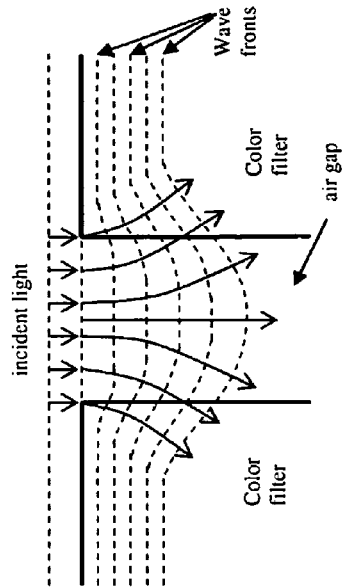
FIG. 3A is an illustration showing light traveling along an air gap between two color filters.
Figure 3B:
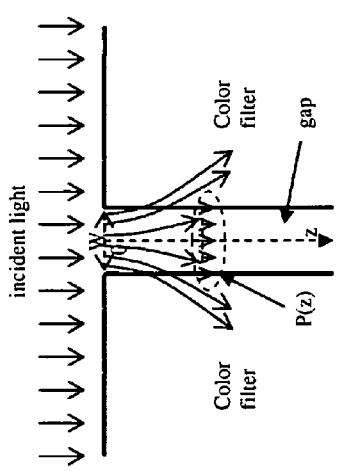
FIG. 3B is an illustration showing the redirection of light from the air gap into the color filters.
Figure 3C:
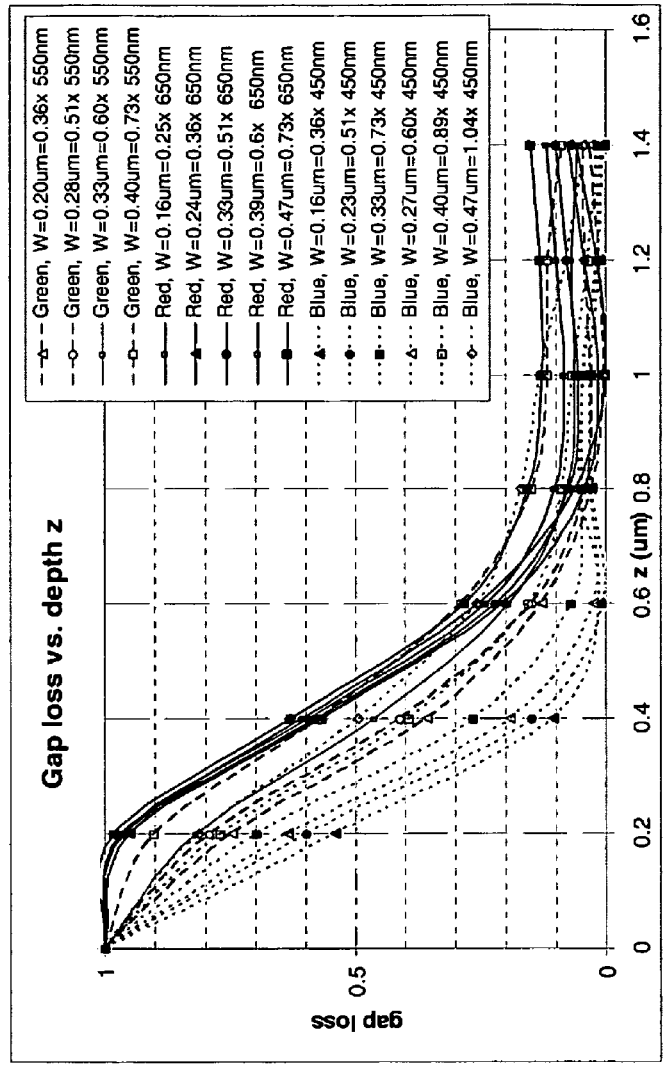
FIG. 3C is a graph of light power versus the distance along the air gap.

Light incident upon a gap between two translucent regions of higher refractive indices become diverted to one or the other when the gap is sufficiently narrow. In particular, light incident upon an air gap between two color filters diverts to one color filter or the other when the gap width is sufficiently small. FIG. 3A shows a vertical gap between two color filter regions filled with a lower refractive index medium, e.g. air. Incident light rays entering the gap and nearer one sidewall than the other is diverted towards and into the former, whereas the rest are diverted towards and into the latter. FIG. 3B shows wavefronts spaced one wavelength apart. Wavefronts travel at slower speed in higher refractive index medium, in this example the color filter having an index n of approximately 1.6. Thus the spacing between wavefronts in the gap, assuming air filled, is 1.6 times that of the color filter, resulting in the bending of wavefronts at the interface between the color filter and air gap and causing the light rays to divert into the color filter. FIG. 3C is a graph of propagated light power P(z) along a vertical axis z of the air gap divided by the incident light power P(0) versus a distance z. As shown by FIG. 3C, light power decreases deeper into the gap for different gap widths, more rapidly for lesser gap widths on the order of one wavelength and converges to be essentially negligible for a gap width of 0.4 times wavelength or less at a depth of 1.5 times wavelength. From FIG. 3C, it is preferable to have a depth equal to at least 1 times the wavelength of the longest wavelength of interest, which is 650 nm in this embodiment for a visible light image sensor. At this depth, the percentage of light power incident upon the gap and lost to the space further below (henceforth "gap loss") is less than 15%. The color filter thus needs to have thickness at least 1 time the wavelength in order to filter incident light entering the gap to prevent unfiltered light from passing on to light guides 130, 114 and eventually to the conversion unit 102. If the gap is filled with a transparent medium other than air, with refractive index $n_{gap}$>1.0, then presumably the gap would need to narrow to 0.45 um/$n_{gap}$ or less, since effectively distances in terms of wavelength remains the same but absolute distances are scaled by 1/$n_{gap}$.

For red light of wavelength in air of 650 nm, at a depth of 0.65 um (i.e. 1.0 time wavelength in air) the gap power flux attenuates to 0.15 (15%) for a gap width of 0.6 time wavelength in air, i.e. 0.39 um. Attenuation reaches maximum at around 1 um of depth. Attenuation is steeper with depth for shorter wavelengths.

Figure 3E:
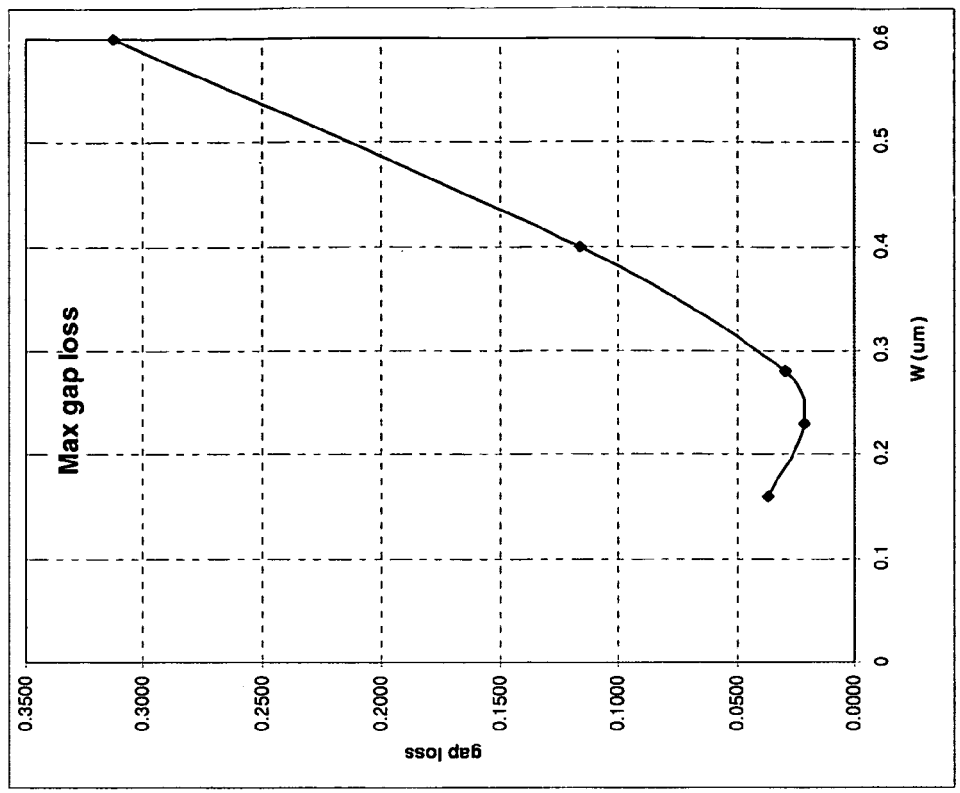
FIG. 3E is a graph of maximal gap power loss versus gap width at a depth of 1.0 um.
Figure 3D:
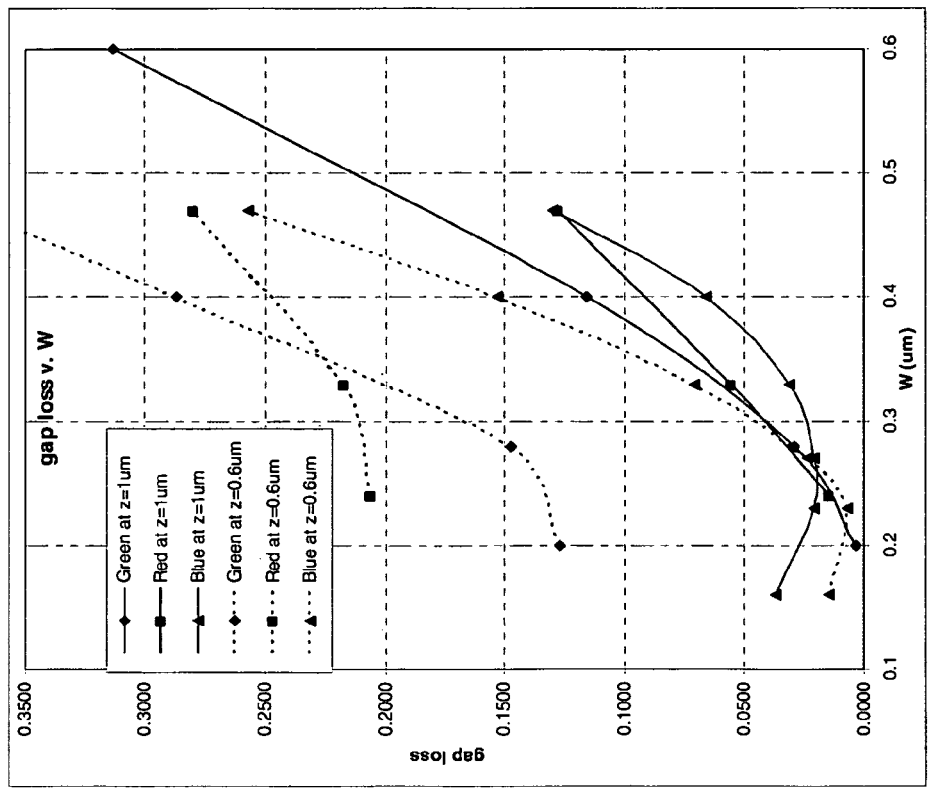
FIG. 3D is a graph of gap power loss versus gap width versus distance along the air gap of widths 0.6 um and 1.0 um for three different colors.
Figures 3F, 3G, 3H, 3I:
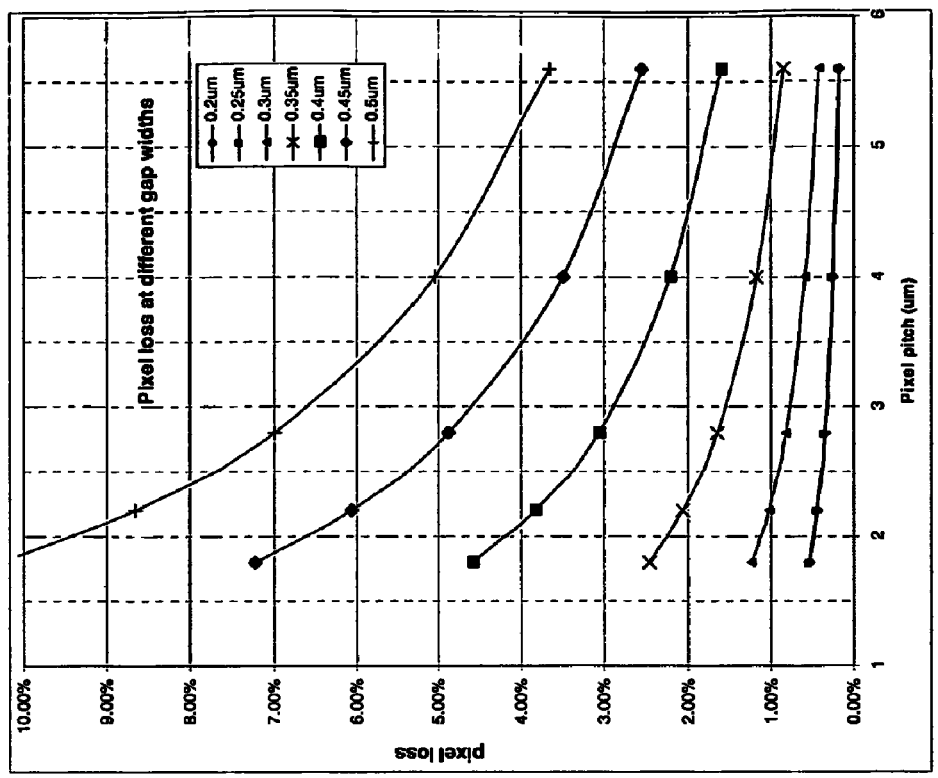
FIG. 3F is a table of maximal gap power loss for different gap widths at a depth of 1.0 um.
FIG. 3G is a table of gap area as percentage of pixel area for different gap widths and different pixel pitches.
FIG. 3H is a table of pixel power loss for different gap widths and different pixel pitches.
FIG. 3I is a graph of pixel power loss versus pixel pitch for different gap widths.

FIG. 3D shows the gap loss versus gap width W for 3 colors—blue at 450 nm wavelength, green at 550 nm, and red at 650 nm—at depths of 0.6 um and 1.0 um, respectively. For a depth of 1.0 um, the highest gap loss among the 3 colors and the maximal gap loss for gap widths of 0.2 um to 0.5 um are plotted in FIG. 3E. Gap loss against gap width is tabulated in FIG. 3F. In FIG. 3G, gap area as percentages of pixel areas is tabulated against pixel pitch and gap width. Each entry (percentage gap area) in the table of FIG. 3G is multiplied with the corresponding column entry (i.e. gap loss) to give pixel loss as tabulated in FIG. 3H. FIG. 3I plots pixel loss versus pixel pitch for different gap widths ranging from 0.2 um to 0.5 um.

FIG. 3I shows that keeping gap width below 0.45 um would result in less than 8% pixel loss for pixel pitch between 1.8 um and 2.8 um—the range of pixel sizes for compact cameras and camera phones—for color filter thickness of 1.0 um. For less than 3%, a gap width below 0.35 um is needed; for less than 1.5%, a gap width below 0.3 um; and for less than 0.5%, a gap width below 0.25 um. FIG. 3I also shows that pixel loss is less for bigger pixels given the same gap width. Thus for pixels larger than 5 um, the above guidelines result in at least halving the pixel loss.

Air interface may continue from the color filter sidewall along the second light guide sidewall and end above protection film 410, creating a second air gap 424. The air interface between second air gap 424 and the second light guide 130 enhances internal reflection for the second light guide 130.

A protection film 410 may be formed above insulating layer 110 of silicon nitride to prevent alkali metal ions from getting into the silicon. Alkali metal ions, commonly found in color filter materials, can cause instability in MOS transistors. Protection film 410 also keeps out moisture. The protection film 410 may be made of silicon nitride (Si3N4) of thickness between 10,000 Angstroms and 4,000 Angstroms, preferably 7,000 Angstroms. If either first light guide 116 or second light guide 130 is made of silicon nitride, the protection film 410 which is formed of silicon nitride is continuous across and above the insulating layer 110 to seal the transistors from alkali metal ions and moisture. If both first 116 and second 130 light guides are not made of silicon nitride, the protection film 110 may cover the top surface of the first light guide 116 to provide similar sealing or, alternatively, cover the sidewalls and bottom of first light guide 116.

First 422 and second 424 air gaps together form a connected opening to air above the top surface of the image sensor. Viewing this in another way, there exists a continuous air interface from the protection film 410 to the top surfaces of the color filters 114B, 114G. In particular, there is an air-gap between the top surfaces 430 of the pixels. The existence of this opening during manufacture allows waste materials formed during the forming of first air gap 422 and second air gap 424 to be removed during the manufacture of the image sensor. If for some reason the first air-gap 422 is sealed subsequently using some plug material, this plug material should have a refractive index lower than the color filter material so that (i) there is internal reflection within the color filter, and (ii) light incident within the air-gap 422 is diverted into the color filters 114B, 114G. Likewise if some fill material fills the second air gap 424, this fill material needs to have a lower refractive index than the second light guide 130.

Together, the color filter 114 and light guides 130 and 116 constitute a "cascaded light guide" that guides light to the photoelectric conversion unit by utilizing total internal reflection at the interfaces with external media such as the insulator 110 and air gaps 422 and 424. Unlike prior art constructions, light that enters the color filter does not cross over to the color filter of the next pixel but can only propagate down to the second light guide 130.

A cascaded light guide further holds a second advantage over prior art that uses opaque wall material between color filters. Incident light falling into the first air gap 422 between color filters 114B and 114G is diverted to either one, thus no light is lost, unlike prior art pixels where light is lost in the gaps between the filters.

A first advantage of this color filter forming method over prior art methods is that the color filter sidewall is not defined by the photoresist and dye materials constituting the color filters. In prior art color filter forming methods, the color filter formed must produce straight sidewalls after developing. This requirement places a limit on the selection of photoresist and dye material because the dye must not absorb light to which the photoresist is sensitive, otherwise the bottom of the color filter will receive less light, resulting in color filter that is narrower at its bottom than its top. The present color filter forming method forms the color filter sidewall by the pocket 210 etched into the support film 134, thus completing removing any constraints on the choice of dye material, resulting in a cheaper process.

A second advantage over prior art color filter forming methods is that gap spacing control is uniform between all pixels, and highly accurate at low cost. The gap spacing is a combination of the line-width in the single lithography step that etches the openings in the support film, plus the control of sideway etching during dry etch. If such gaps were to be created by placing 3 color filters of different colors at 3 different lithography steps as in the prior art, uniformity of gap widths is impossible, the lithography steps become expensive, and sidewall profile control becomes even more stringent.

A cascaded light guide wherein a color filter and a light guide are formed in the same opening in the support film (henceforth "self-aligned cascaded light guide") has an advantage over prior art in that there is no misalignment between the color filter 114 and the second light guide 130. The color filter 114 has sidewalls that are self-aligned to sidewalls of the second light guide 130.

Figure 4A:
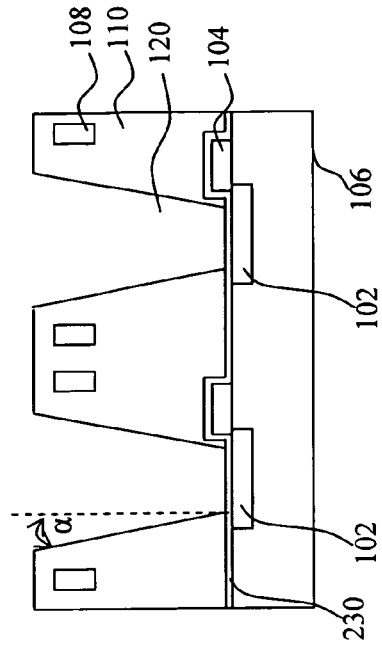
Figure 4B:
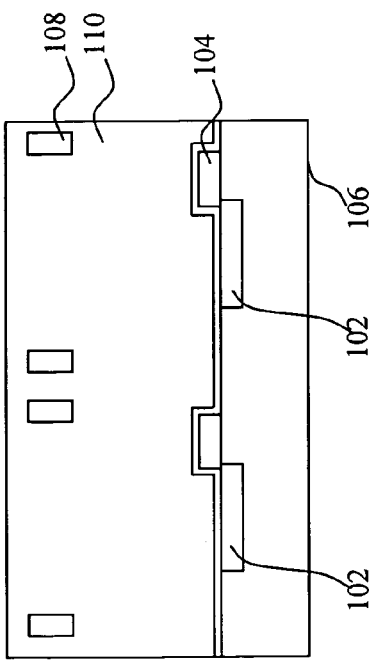

FIGS. 4A-L show a process for forming the image sensor 100. The sensor may be processed to a point wherein the conversion units 102 and electrodes 104 are formed on the silicon substrate 106 and the wires 108 are embedded in the insulator material 110 as shown in FIG. 4A. The insulator 110 may be constructed from a low refractive index material such as silicon dioxide. The top of the insulator 110 can be flattened with a chemical mechanical polishing process ("CMP").

As shown in FIG. 4B, insulating material may be removed to form light guide openings 120. The openings 120 have sloping sidewalls at an angle α. The openings 120 can be formed, by example, using a reactive ion etching ("RIE") process. For silicon oxide as the insulating material, a suitable etchant is $CF_4+CHF_3$ in a 1:2 flow ratio, carried in Argon gas under 125 mTorr, 45° C. The sidewall angle may be adjusted by adjusting the RF power between 300 W and 800 W at 13.56 MHz.

Figure 4C:
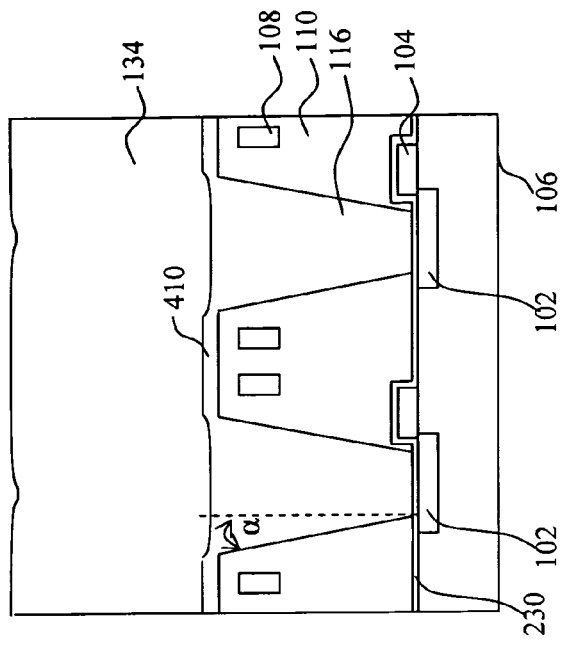

FIG. 4C shows the addition of light guide material 122. By way of example, the light guide material 122 can be a silicon nitride that has an index of refraction greater than the refractive index of the insulating material 110. Additionally, silicon nitride provides a diffusion barrier against $H_2O$ and alkali metal ions. The light guide material can be added for example by plasma enhanced chemical vapor deposition ("PECVD").

The light guide material may be etched so that the material covers the insulator. This seals the conversion unit and electrodes during subsequent processes. Alternatively, if the first light guide material 122 is not silicon nitride, then a silicon nitride film may be deposited on top of light guide material 122 such that silicon nitride film seals the conversion unit and electrodes. This silicon nitride film may be between 10,000 Angstroms and 4,000 Angstroms thick, preferably 7,000 Angstroms.

Figure 4D:
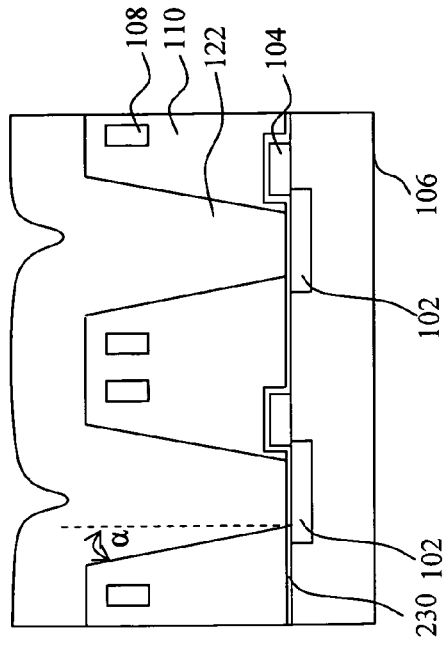

A shown in FIG. 4D a support film 134 is formed on top of the silicon nitride. The support film 134 may be silicon oxide.

In FIG. 4E, the support film is etched to form openings. The openings may include sidewalls 136 that slope at an angle β. The angle β is selected so that $β<90-\mathrm{asin}(1/n2_{light\ guide})$, where $n2_{light\ guide}$ is the index of refraction of the second light guide material 130, such that there is a total internal reflection within the second light guides 130. Incorporating two separate lights guides reduces the etching depth for each light guide. Consequently, slope side wall etching is easier to achieve with higher accuracy. The support film 134 and second light guides 130 can be made from the same materials and with the same processes as the insulating layer 110 and first light guides 116, respectively.

As shown in FIG. 4E the sidewall may have a vertical portion and a sloped portion. The vertical portion and sloped portion can be achieved by changing the etching chemistry or plasma conditions during the etching process. The etch recipe during the vertical portion etch is selected to be favorable for forming the vertical sidewall 162, then switched to a recipe favorable for forming the sloped sidewall.

Figure 4I:
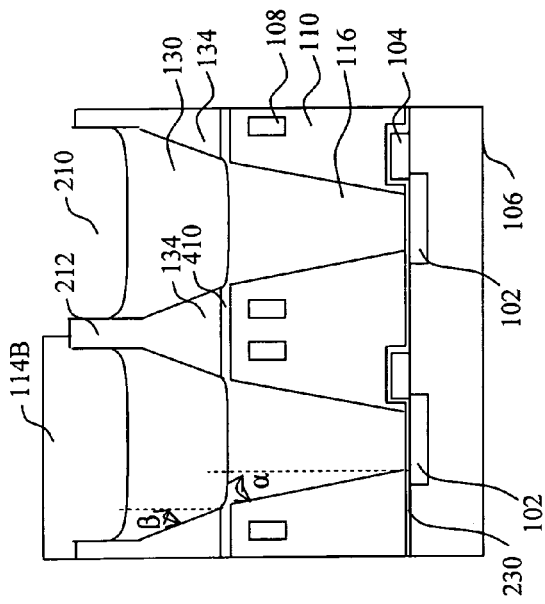

FIG. 4F shows the addition of light guide material. By way of example, the light guide material can be a silicon nitride. The light guide material can be added for example by plasma enhanced chemical vapor deposition ("PECVD"). FIG. 4G shows each second light guide 130 has a pocket 210. The pockets 210 are separated by a sidewall 212 of the support film 134. As shown in FIG. 4H, a color film material 114B having a dye of a particular color is applied to fill the pockets 210 and extends above the support film 134. In this example, the color material may contain blue dye. Color filter material is typically made of negative photoresist, which forms polymers that when exposed to light becomes insoluble to a photoresist developer. A mask (not shown) is placed over the material 114 with openings to expose areas that are to remain while the rest is etched away. FIG. 4I shows the sensor after the etching step. The process can be repeated with a different color material such as green to create color filters for each pixel as shown in FIG. 4J.

The pockets 210 provide an alignment feature to align the color filter material with the second light guide 130. The pockets 210 may be larger than the corresponding mask openings. The etchant may be adjusted to create more sideways (i.e. isotropic) etch and reduce the thickness of the side wall 212. This results in an optimal second light guide opening for a given pixel pitch.

Figure 4K:
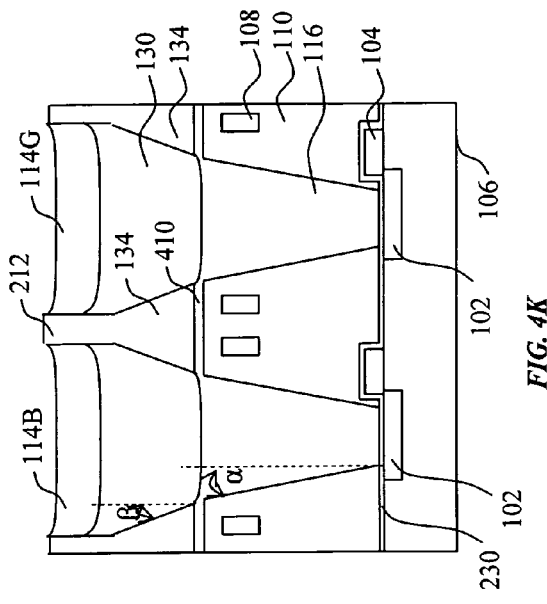
Figure 4J:
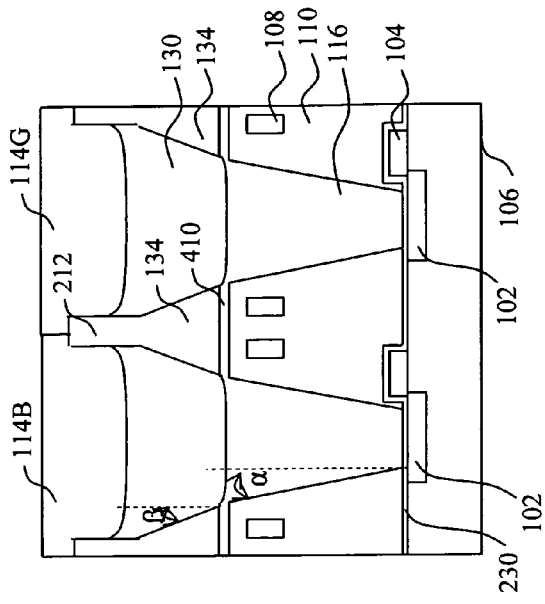
Figure 4L:
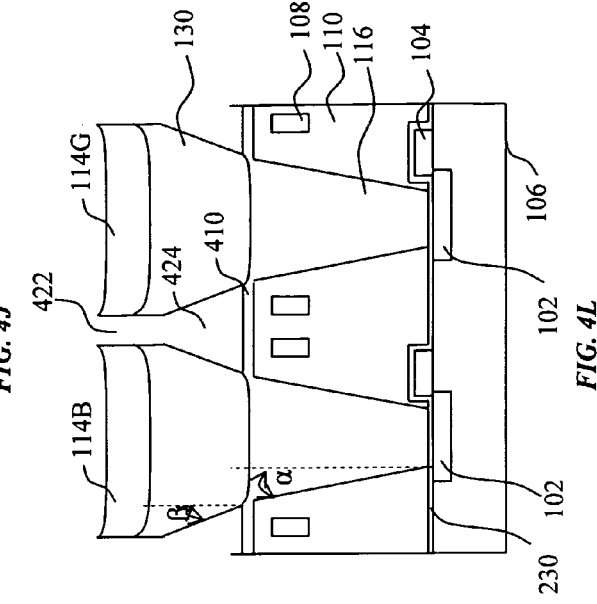
Figure 7:
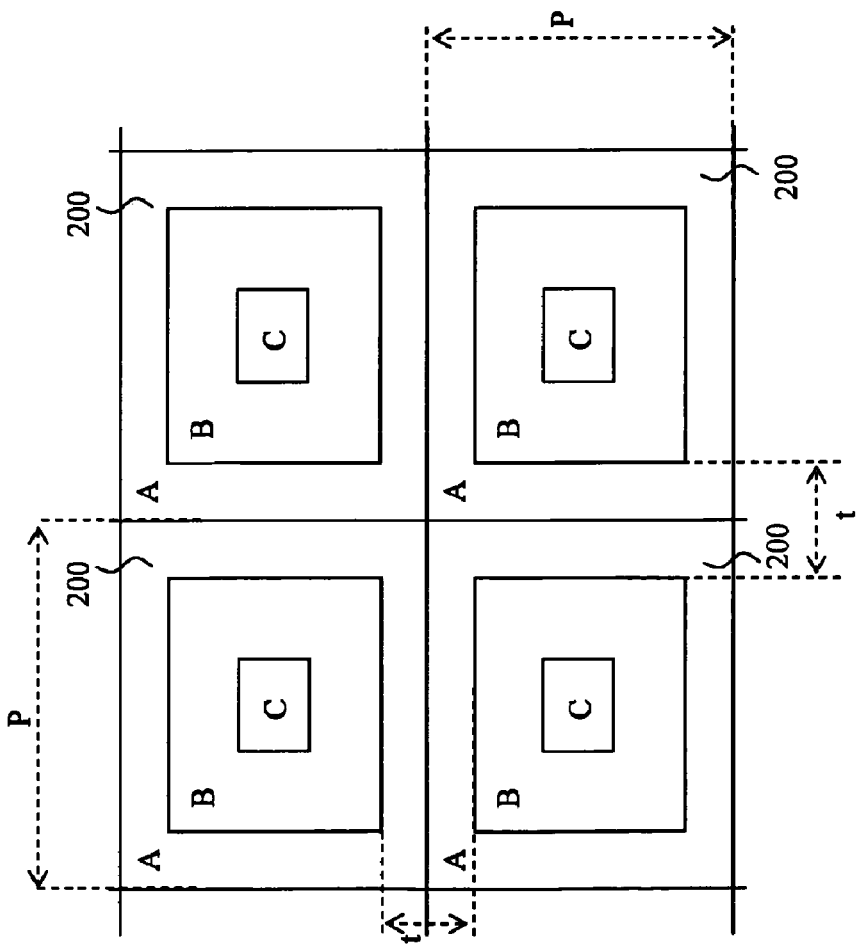
FIG. 7 is an illustration showing a top view of four pixels within an array.

As shown in FIG. 4K the color filter is etched to expose the support wall 212 of the support film 134. A portion of the support film is then removed as shown in FIG. 4L so that there is an air/material interface for the color filters 114 and second light guide 130. As shown in FIG. 5, light internally reflects along the color filters 114 and light guides 130 and 116. The color filter 114 has a higher refractive index than air so that the filter 114 provides internal reflection. Likewise, the second light guide 130 has an air interface which improves the internal reflection properties of the guide. FIG. 7 is a top view showing four pixels 200 of a pixel array. For embodiments that include both first and second light guides the area B may be the area of the second light guide top surface and the area C represents the area of the first light guide bottom surface.

Figure 8:
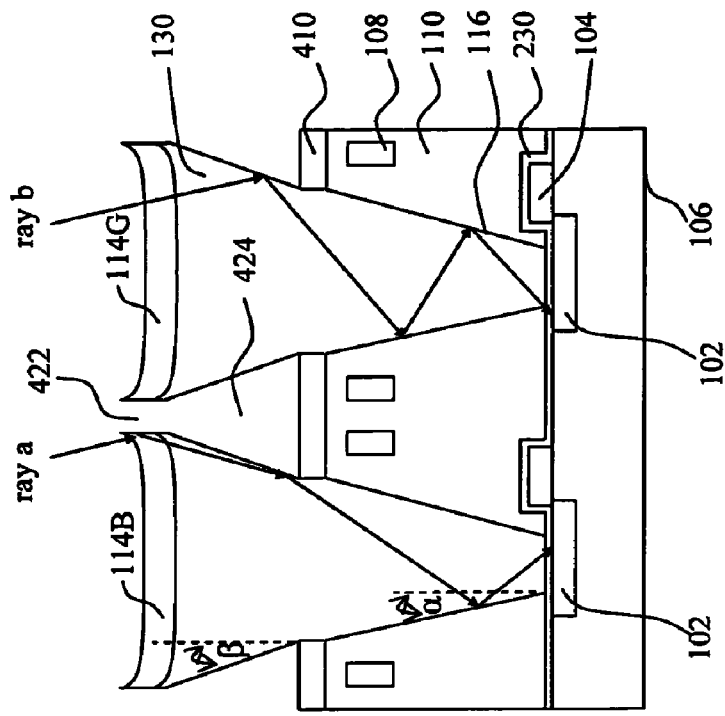
FIG. 8 is an alternate embodiment of the sensor pixels with ray tracing.
Figure 9A:
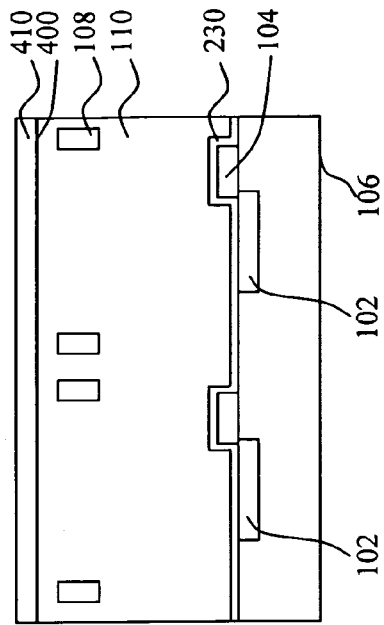
FIGS. 9A-M are illustrations showing a process used to fabricate the pixels shown in FIG. 8.
Figure 9B:
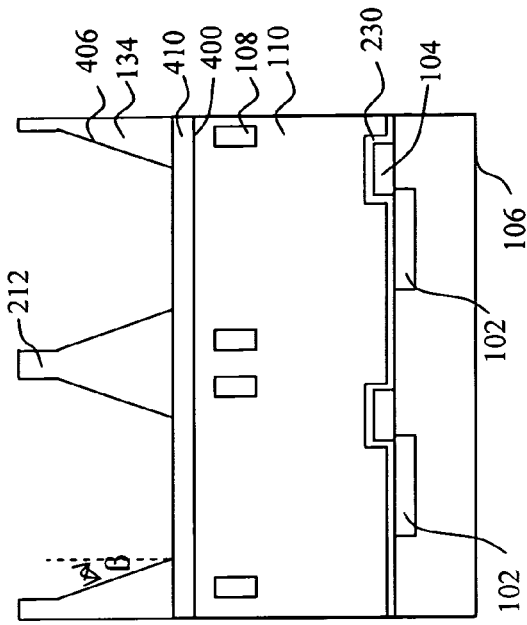
Figure 9C:
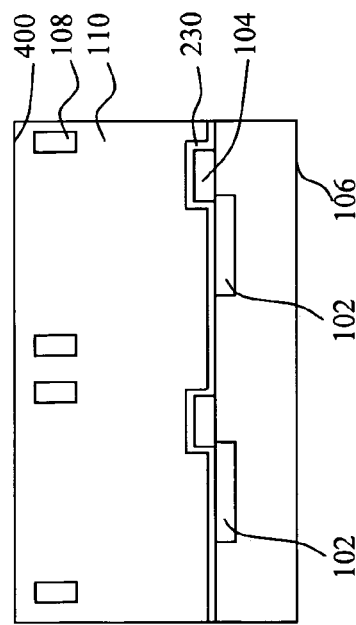
Figure 9D:
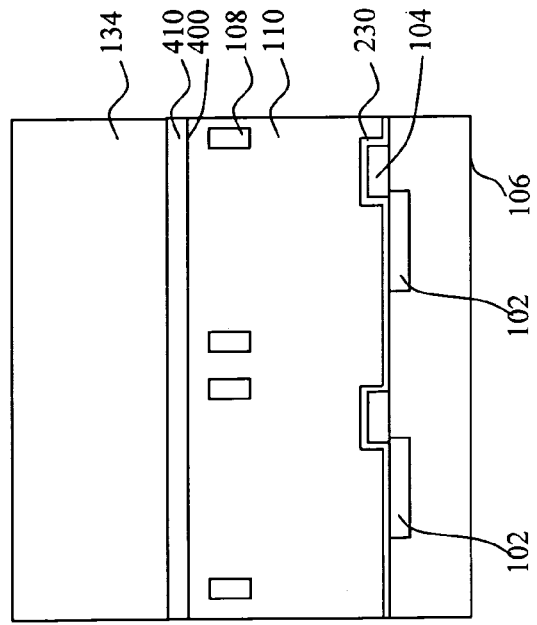
Figure 9E:
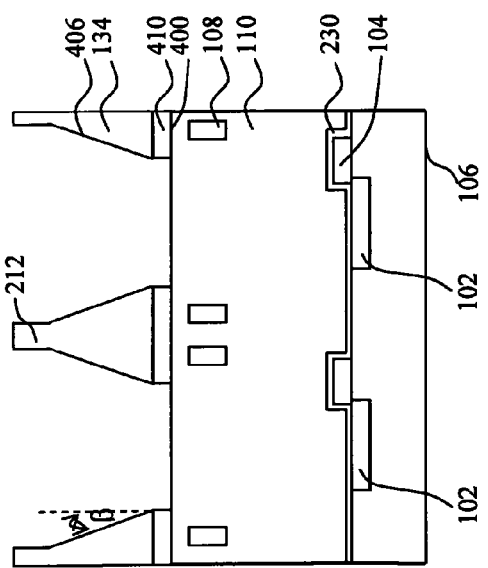
Figure 9F:
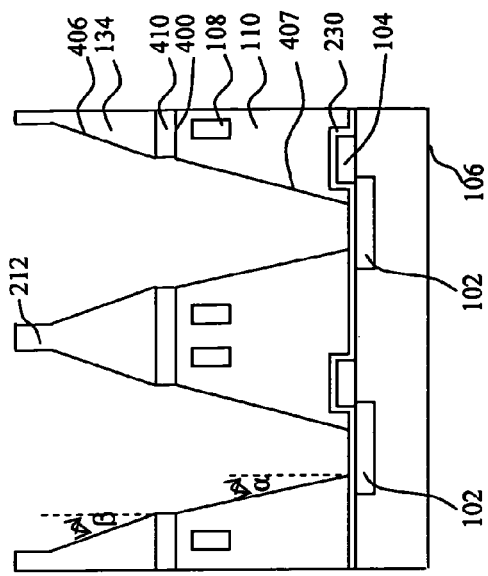
Figure 9G:
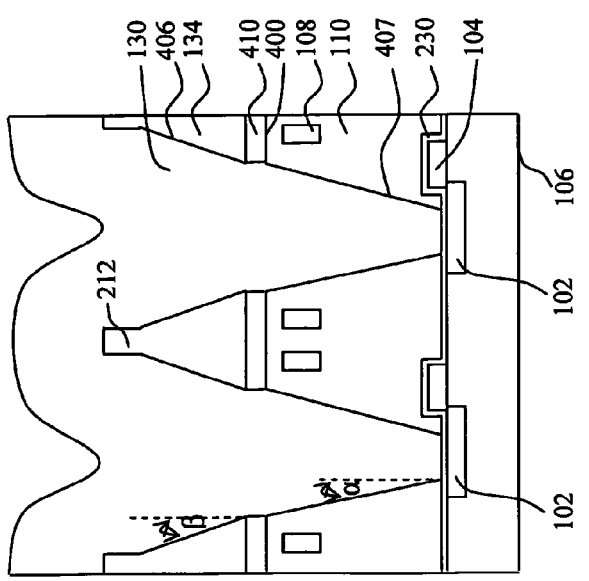
Figure 9H:
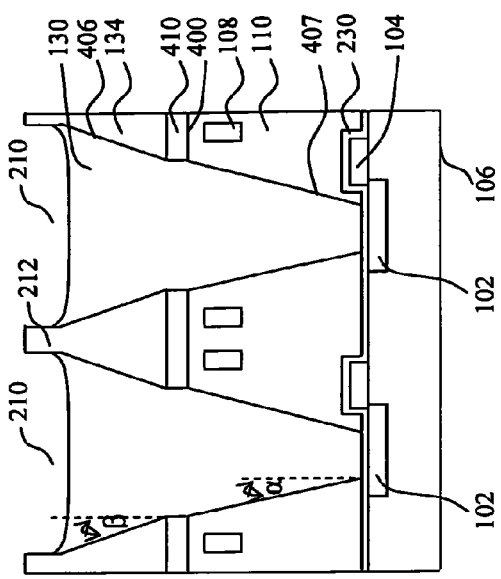
Figure 9I:
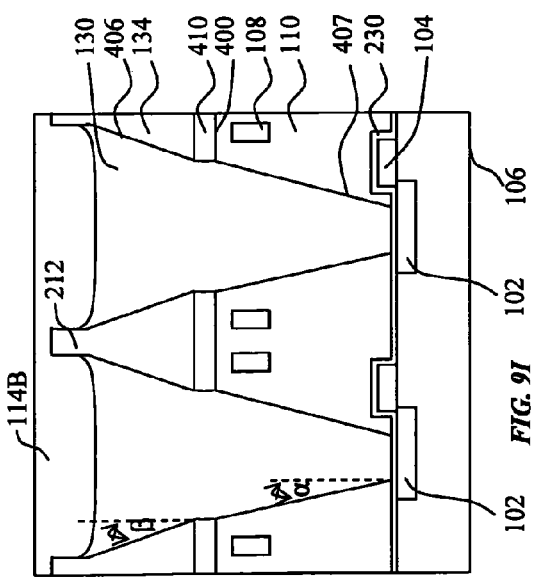
Figure 9J:
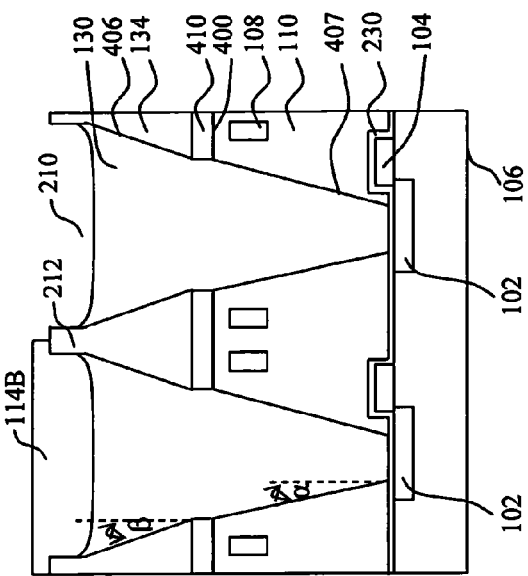
Figure 9K:
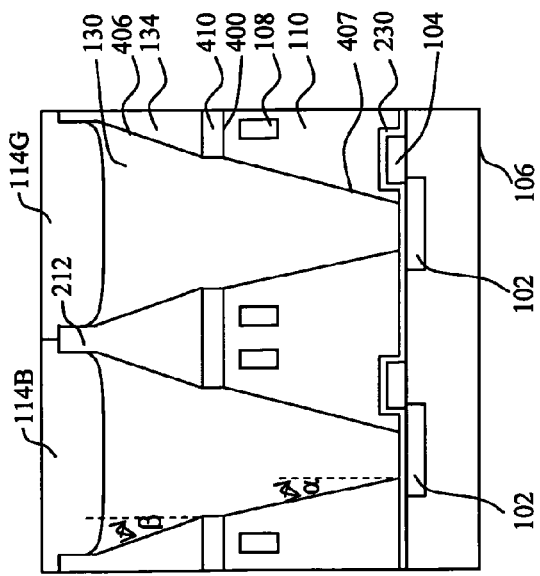
Figure 9L:
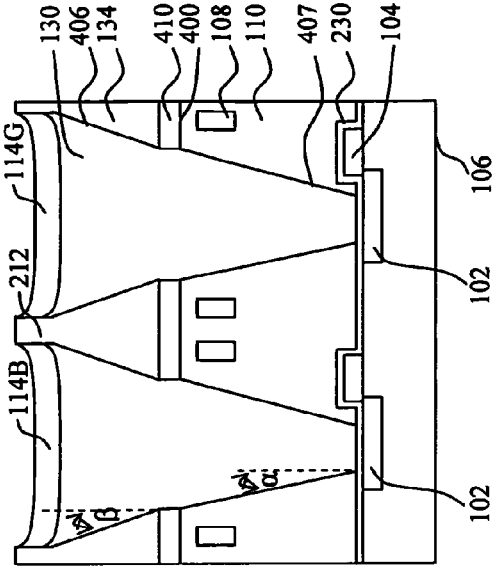
Figure 9M:
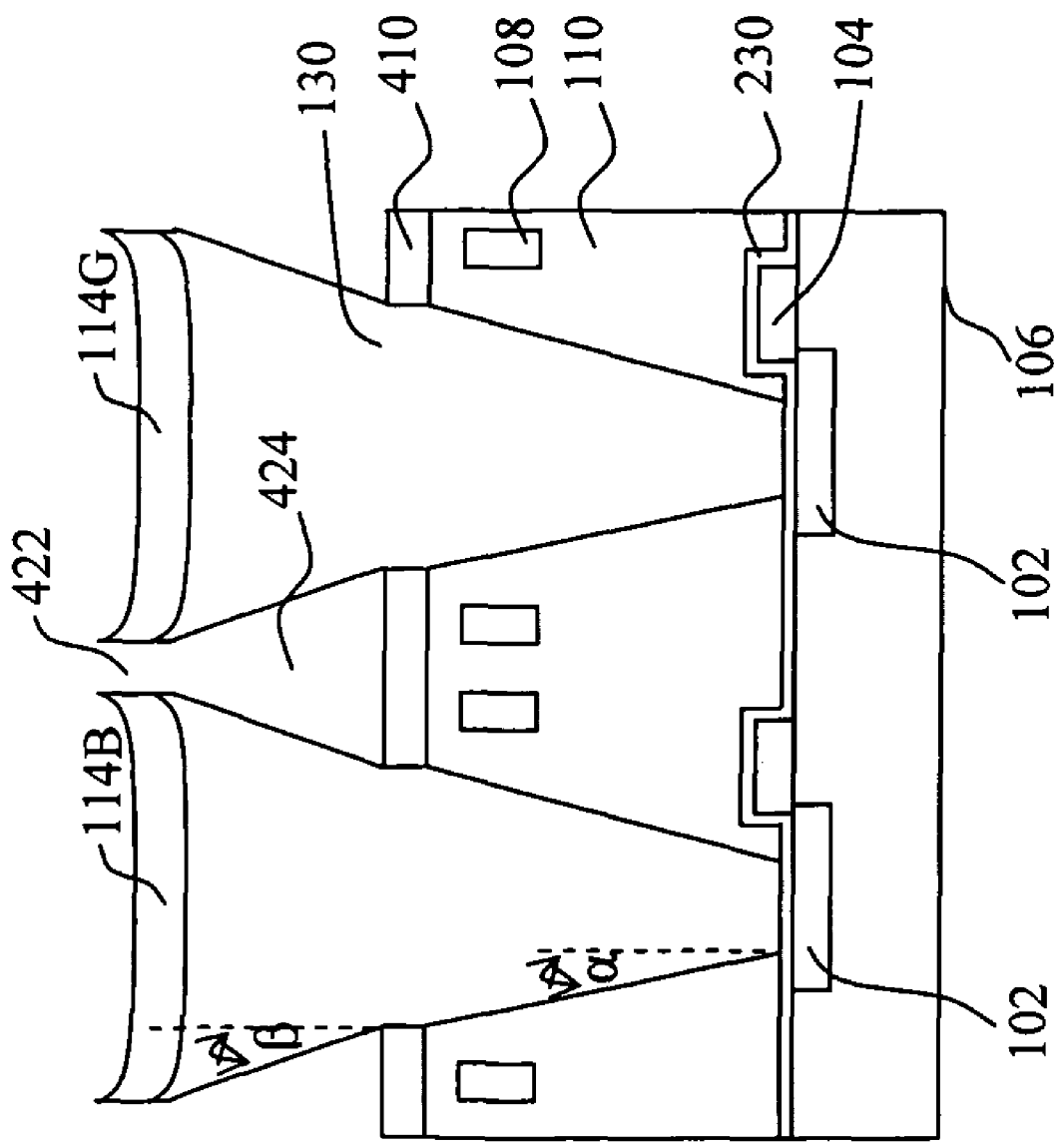

FIG. 8 shows an alternate embodiment wherein the lights guides are made from the same material. A process for fabricating the alternate embodiment is shown in FIGS. 9A-M. The process is similar to the process shown in FIGS. 4A-L, except the opening for the first light guide is formed after the opening for the second light as shown in FIG. 9F. Both light guides are formed in the same step shown in FIG. 9G.

FIGS. 10A-H show a process to expose bond pads 214 of the image sensor. An opening 216 is formed in a first insulator material 110 that covers a bond pad 214 as shown in FIGS. 10A-B. As shown in FIGS. 10C-D the first light guide material 116 is applied and a substantial portion of the material 116 is removed. The support film material 134 is applied and a corresponding opening 218 is formed therein as shown in FIGS. 10E-F. The second light guide material 130 is applied as shown in FIG. 10G. As shown in FIG. 10H a maskless etch step is used to form an opening 220 that exposes the bond pad 214. The etchant preferably has a characteristic that attacks light guide material 110 and 130 (e.g. silicon nitride) much faster than the insulator material 110 and 134 (silicon oxide) and color filter 114 (photoresist). Dry etch in $CH_3F/O_2$ has 10× greater etch rate on silicon nitride than on color filter or silicon oxide.

Figure 11:
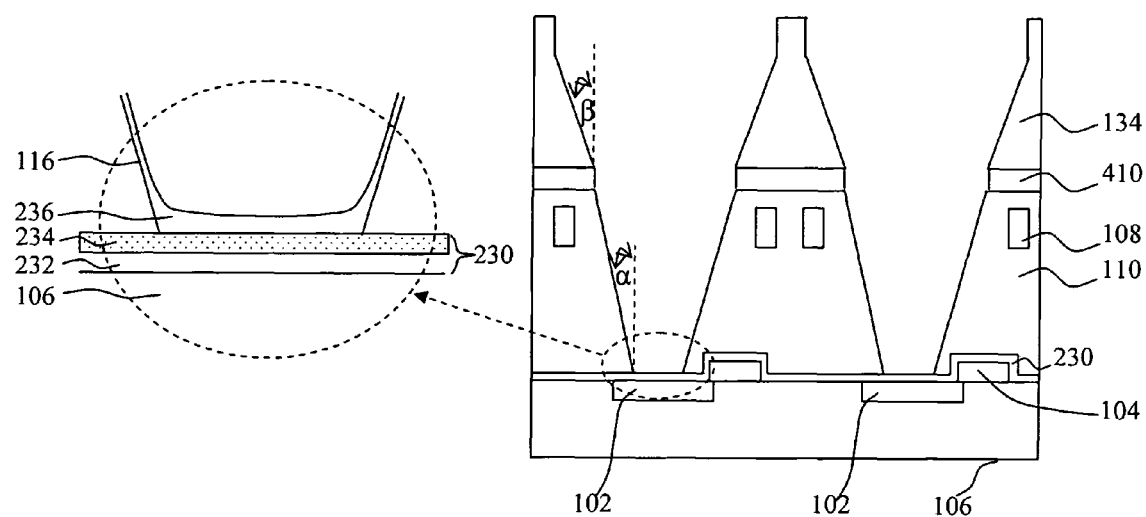
FIG. 11 is an illustration showing an anti-reflection layer within the sensor.

FIG. 11 shows an embodiment wherein an anti-reflection (AR) stack comprising a top AR film 236, a second AR film

234, and a third AR film 236 cover the conversion units 102. The anti-reflection stack improves the transmission of light from the first light guide 116 to the conversion units 102. Members of the AR stack together may constitute layer 230 that also blanket the substrate 106, conversion units 102 and electrodes 104 to protect the elements from chemical pollutants and moisture. For example, the second AR film 234 may be a contact etch-stop nitride film common in CMOS wafer fabrication, constituting layer 230. The third AR film 232 may be silicon oxide. This silicon oxide film may be a gate insulating film under the gate electrode 114, or the spacer liner oxide film that runs down the side of the gate electrode 114 between the gate and the spacer (not shown) in common deep submicron CMOS processes, a silicide-blocking oxide film (commonly used to prevent stress-induced leakage in image sensor pixels) deposited before contact silicidation to block contact siliciding, or a combination thereof. Using an existing silicon nitride contact etch-stop film as part of the AR stack provides cost savings. The same contact etch-stop film also functions to stop the etch of the opening in insulator 110 for fabrication of the light guide. Finally, the top AR film 236 is formed in the opening in the insulator 110 prior to filling the opening with light guide material.

The top AR film 236 has a lower refractive index than the light guide 116. The second film 234 has a higher refractive index than the top film 236. The third film 232 has a lower refractive index than the second film 234.

The top AR film 236 may be silicon oxide or silicon oxynitride, with a thickness between 750 Angstrom and 2000 Angstrom, preferably 800 Angstrom. The second film 234 may be silicon nitride ($Si_3N_4$), with a thickness between 300 Angstrom and 900 Angstrom, preferably 500 Angstrom. The third film may be silicon oxide or silicon oxynitride ($SiOxNy$, where $0<x<2$ and $0<y<4/3$), with a thickness between 25 Angstrom and 170 Angstrom, preferably 75 Angstrom.

The anti-reflection structure shown in FIG. 11 can be fabricated by first forming the third AR film 232 and the second AR film 234 over the substrate, respectively. The insulator 110 is then formed on the second AR film 234. The silicon nitride film is formed on the first insulator 110 in a manner that covers and seals the insulator and underlying layers to form a protection film 410 with a thickness between 10,000 Angstrom and 4,000 Angstrom, preferably 7,000 Angstrom. The support film 134 is formed on the light guide material.

The support film 134 is masked and a first etchant is applied to etch openings in the support film 134. The first etchant is chosen to have high selectivity towards the silicon nitride protection film material. For example, if support film 134 is HDP silicon oxide, the first etchant may be $CHF_3$, which etches HDP silicon oxide 5 times as fast as silicon nitride. A second etchant is applied to etch through the silicon nitride protection film material to deepen the openings. The second etchant may be $CH_3F/O_2$. The first etchant is again applied to etch the first silicon dioxide insulator material but not the silicon nitride contact etch-stop film 234. The silicon nitride acts as an etchant stop that defines the bottom of the opening. The top AR film 236 is then formed in the opening. An etchant can be applied to etch away the top AR film material that extends along the sidewalls of the opening, for example by dry etch using the first etchant and holding the wafer substrate at a tilt angle and rotated about the axis parallel to the incoming ion beam. Light guide material is then formed in the openings. The color filter can be formed over the light guide and a portion of the support film can be etched to create the structure shown in FIG. 5.

FIGS. 12A-E show a process for fabricating another embodiment of anti-reflection between the light guide and substrate. In this embodiment an etch-stop film 238 is interposed between the light guide and the anti-reflection stack comprising the top AR film 236, second AR film 234, and third AR film 232. The light guide etch-stop film 238 may be formed of the same material as the light guide, and may be silicon nitride, with a thickness between 100 Angstrom and 300 Angstrom, preferably 150 Angstrom. Forming the AR stack in this embodiment has an advantage of more precise control of the thickness of the second AR film, at the expense of one more deposition step and the slight added complexity of etching through a oxide-nitride-oxide-nitride-oxide stack instead of oxide-nitride-oxide stack. The previous embodiment uses the second AR film 234 as a light guide etch stop and loses some of thickness to the final step of insulator pit etch over-etch.

Figure 12A:
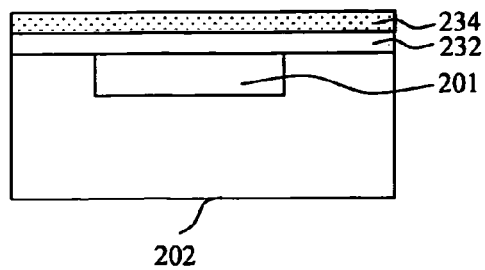
FIGS. 12A-E are illustrations showing an alternate process to form an anti-reflection layer within the sensor.
Figure 12B:
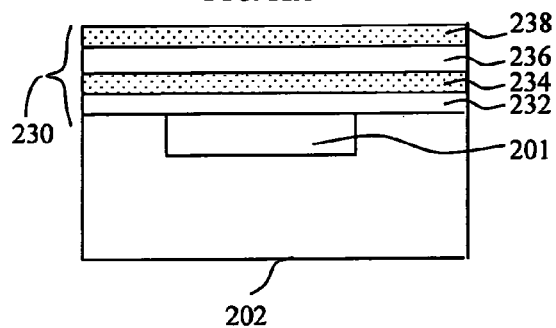
Figure 12C:
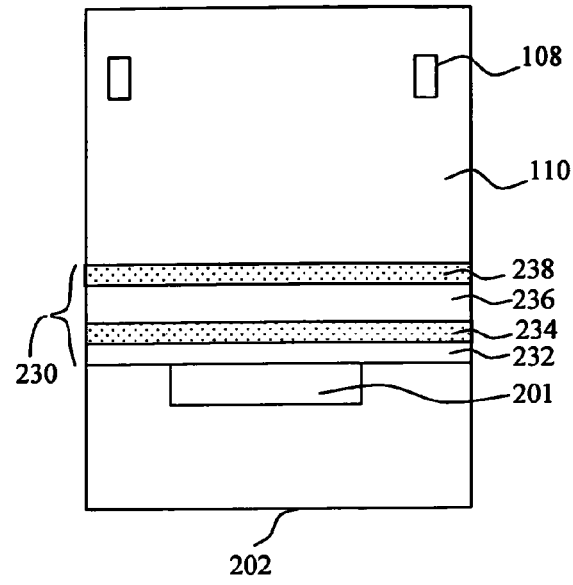
Figure 12D:
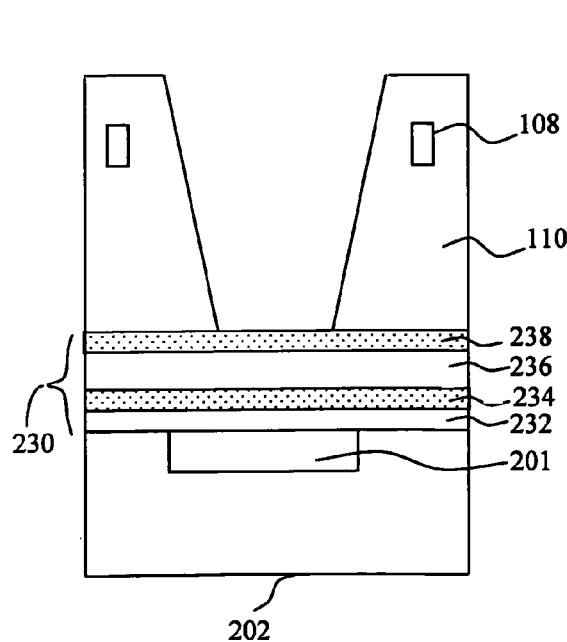
Figure 12E:
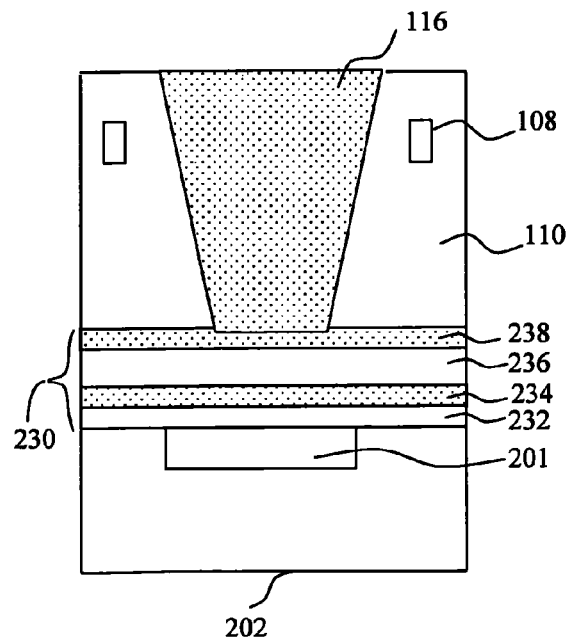

As shown in FIGS. 12A-B, the third 232 and second 234 AR films are applied to the substrate 106 and then a top AR film 236 is applied onto the second AR film 234, followed by a light guide etch-stop film 238 made of silicon nitride. As shown in FIG. 12C, the insulator layer 110 and wiring electrodes 108 are formed above the AR films and light guide etch-stop film. FIG. 12D shows an opening formed in insulator 110, stopping at the top of the light guide etch-stop film 138. FIG. 12E shows the opening filled with light guide material.

Figure 13A:
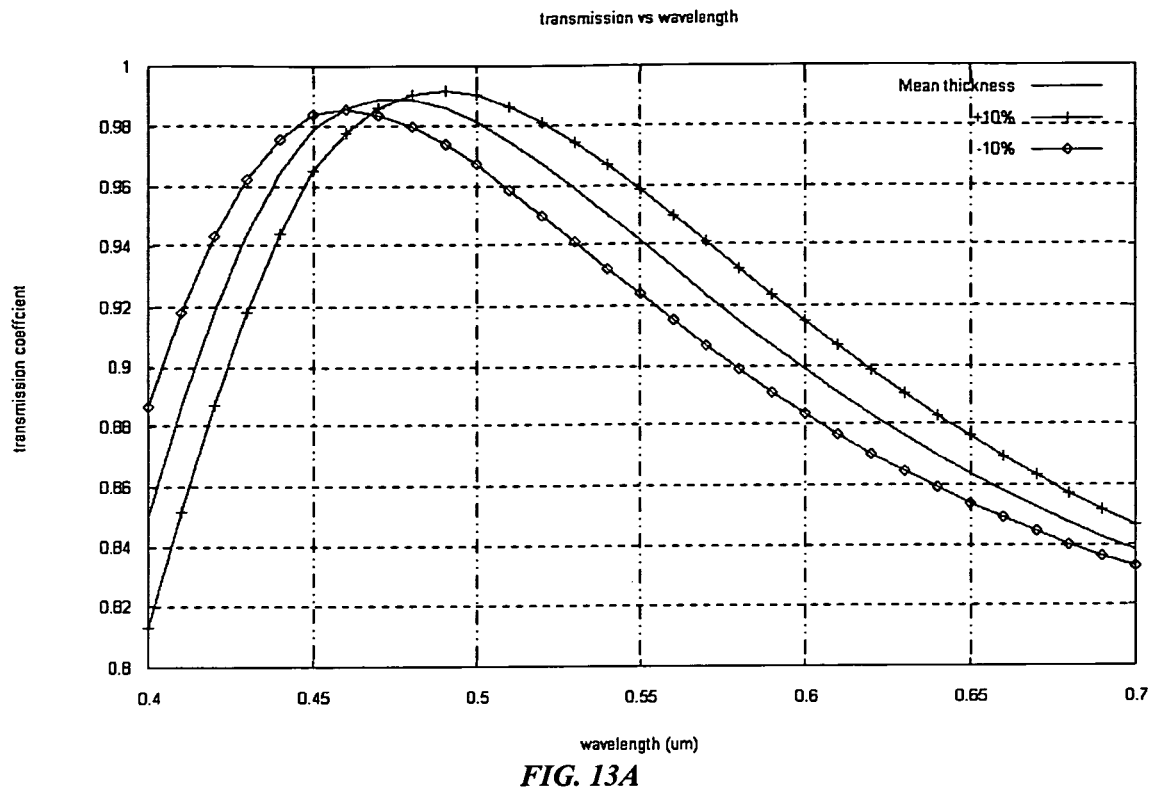
FIG. 13A is a graph of transmission coefficient versus light wavelength for an anti-reflection layer.

FIG. 13A is a graph of transmission coefficient versus light wavelength for the anti-reflection layer of FIG. 11 and FIG. 12E, for nominal top AR film (oxide) of 800 Angstroms thick, and varied +/−10%, whereas second AR film (nitride) is 500 Angstroms thick and third AR film (oxide) is 75 Angstroms thick. It exhibits steep decline in the violet color region (400 nm to 450 nm). The nominal thicknesses of the AR films constituting the AR layer are chosen to position the maximum of the transmission curve in the blue color region (450 nm to 490 nm) than green color region (490 nm to 560 nm) so that any shift in film thicknesses due to manufacturing tolerance would not result in transmission coefficient falloff much more in violet than in red color region (630 nm to 700 nm).

Figure 13B:
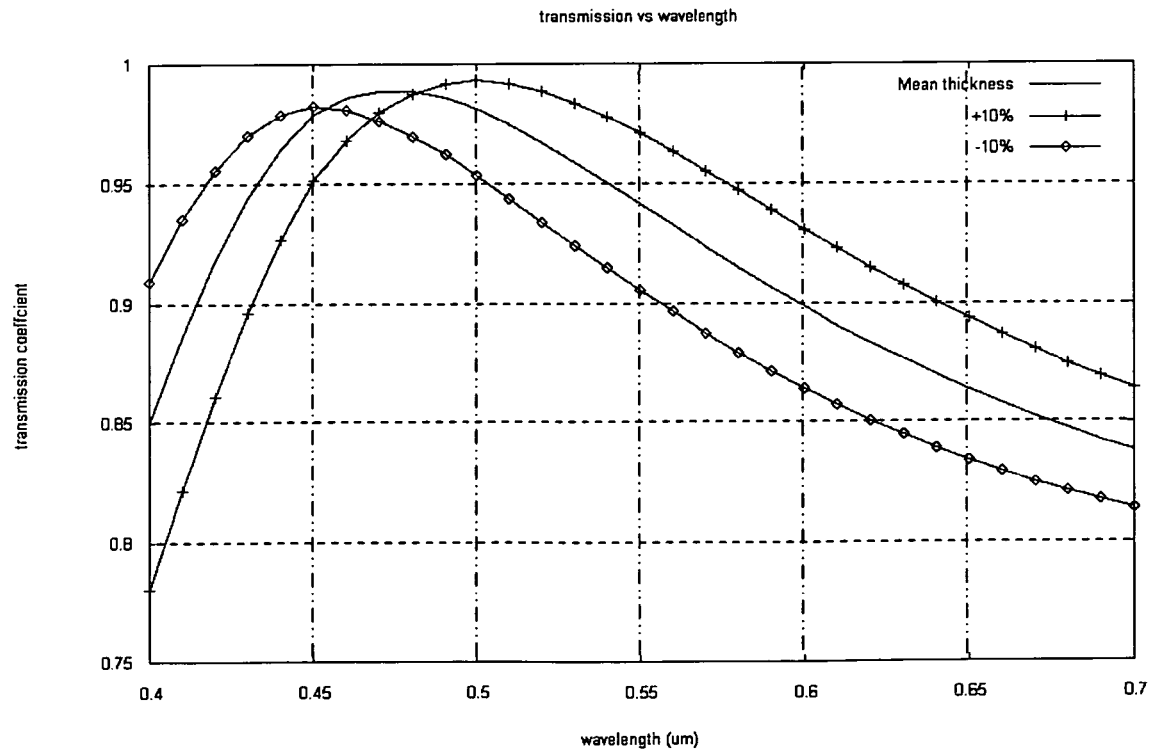
FIG. 13B is a graph of transmission coefficient versus light wavelength for the anti-reflection layer.

FIG. 13B is a graph of transmission coefficient versus light wavelength for the anti-reflection layer of FIG. 11 and FIG. 12E, for nominal second AR film (nitride) of 500 Angstroms thick, and varied +/−10%.

Figure 13C:
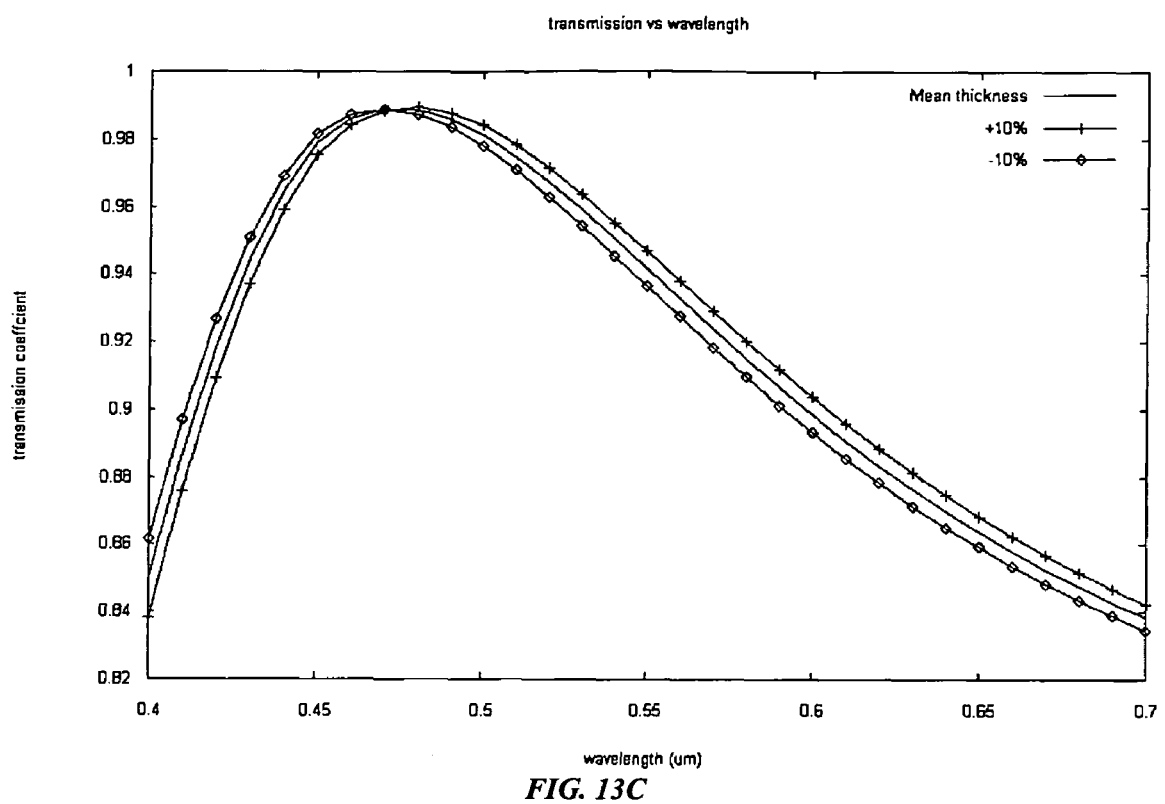
FIG. 13C is a graph of transmission coefficient versus light wavelength for the anti-reflection layer.

FIG. 13C is a graph of transmission coefficient versus light wavelength for the anti-reflection layer of FIG. 11 and FIG. 12E, for nominal third AR film (nitride) of 75 Angstroms thick, and varied +/−10%.

Figure 14A:
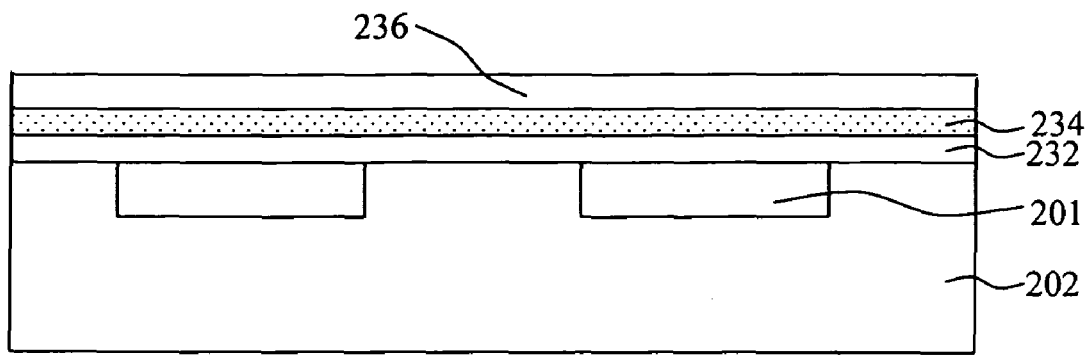
FIGS. 14A-G are illustrations showing an alternate process to form two anti-reflection layers within the sensor.
Figure 14B:
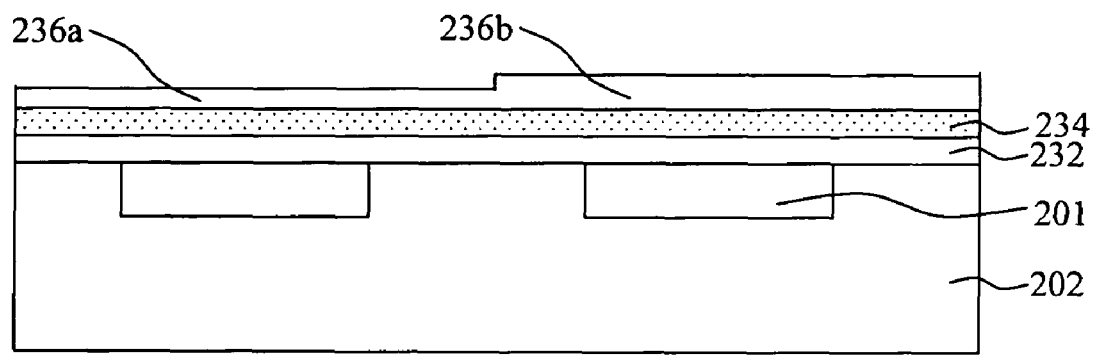
Figure 14C:
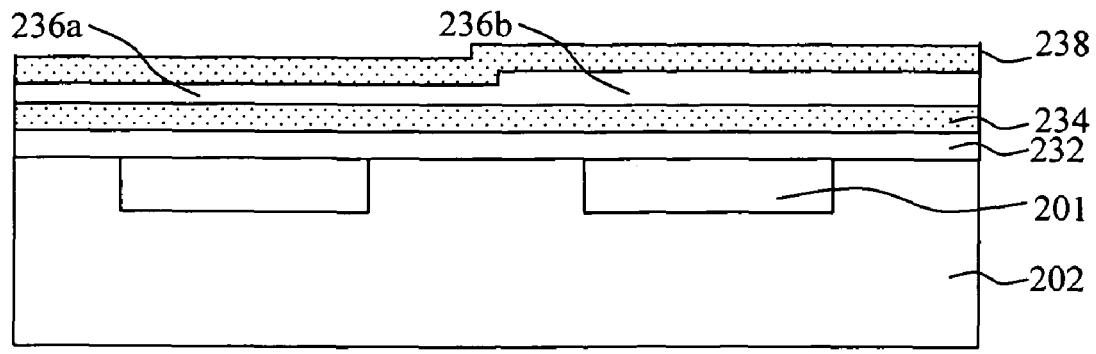
Figure 14D:
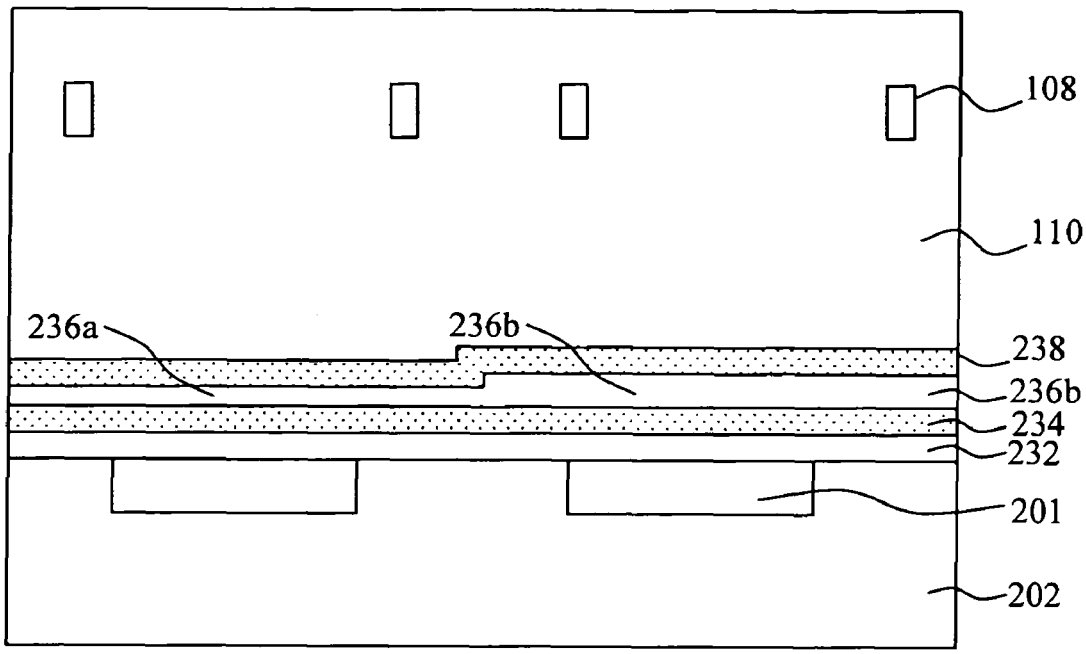
Figure 14E:
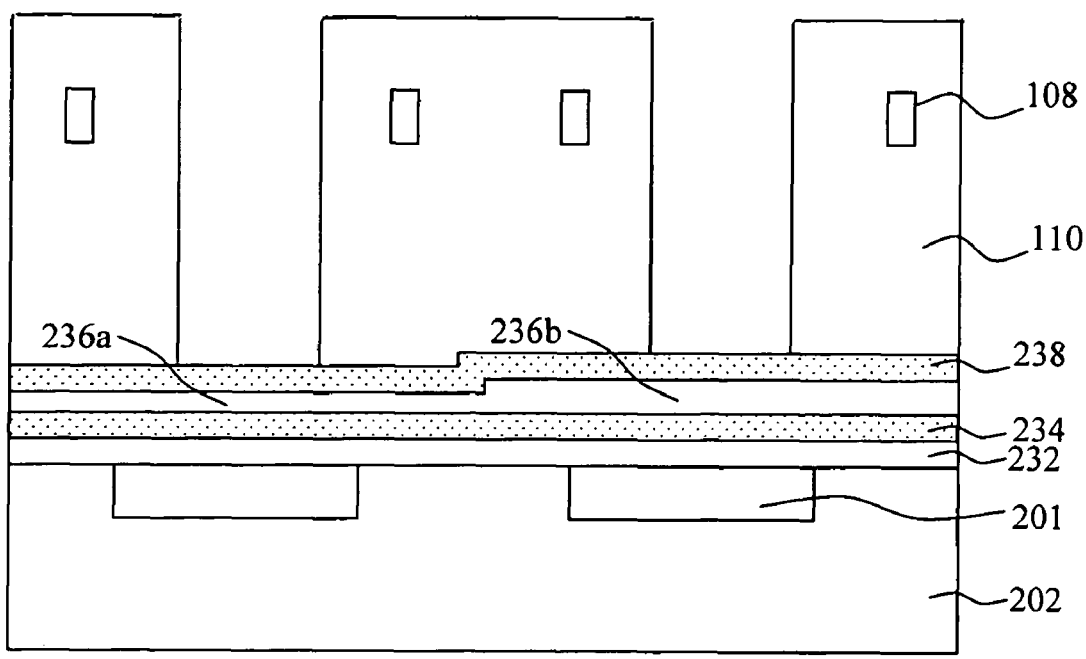
Figure 14F:
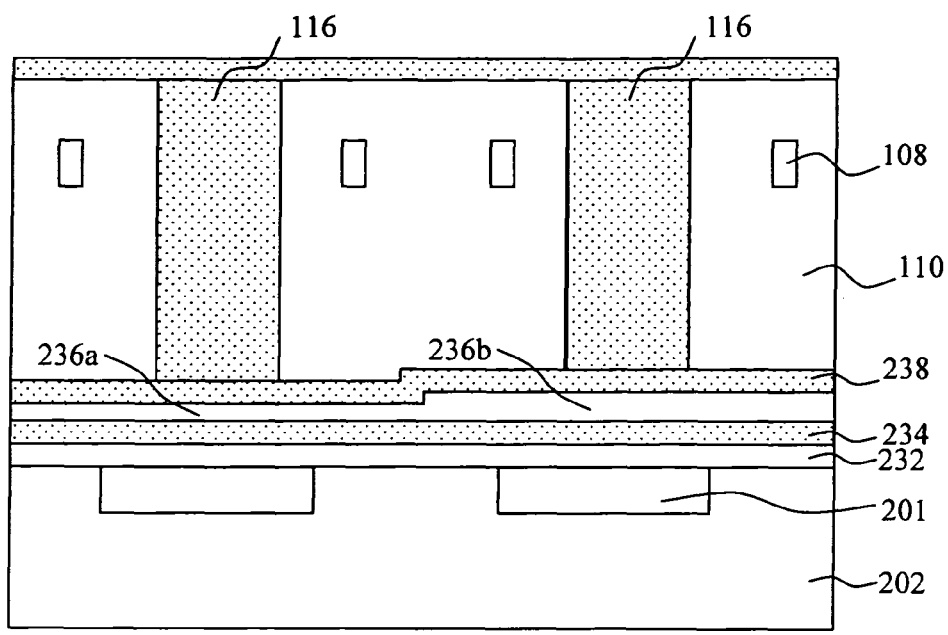

FIGS. 14A-G show a process for fabricating another embodiment of anti-reflection between the light guide and substrate to provide two different AR layers that each optimize for a different color region. Third and second AR film 232 and 234 are provided over the photoelectric conversion unit 201 in FIG. 14A, similar to the embodiment shown in FIG. 12A. In FIG. 14A, the top AR film 236 is deposited to the thickness of thicker top AR film 236b shown in FIG. 14B. Subsequently a lithography mask (not shown) is applied to create mask openings over the pixels that use the thinner top AR film 236a. An etch step is applied to thin the top AR film 236 under the mask opening to the smaller thickness of top AR film 236a in FIG. 14B. Subsequent steps are identical to FIGS. 12B-E.

Figure 14G:
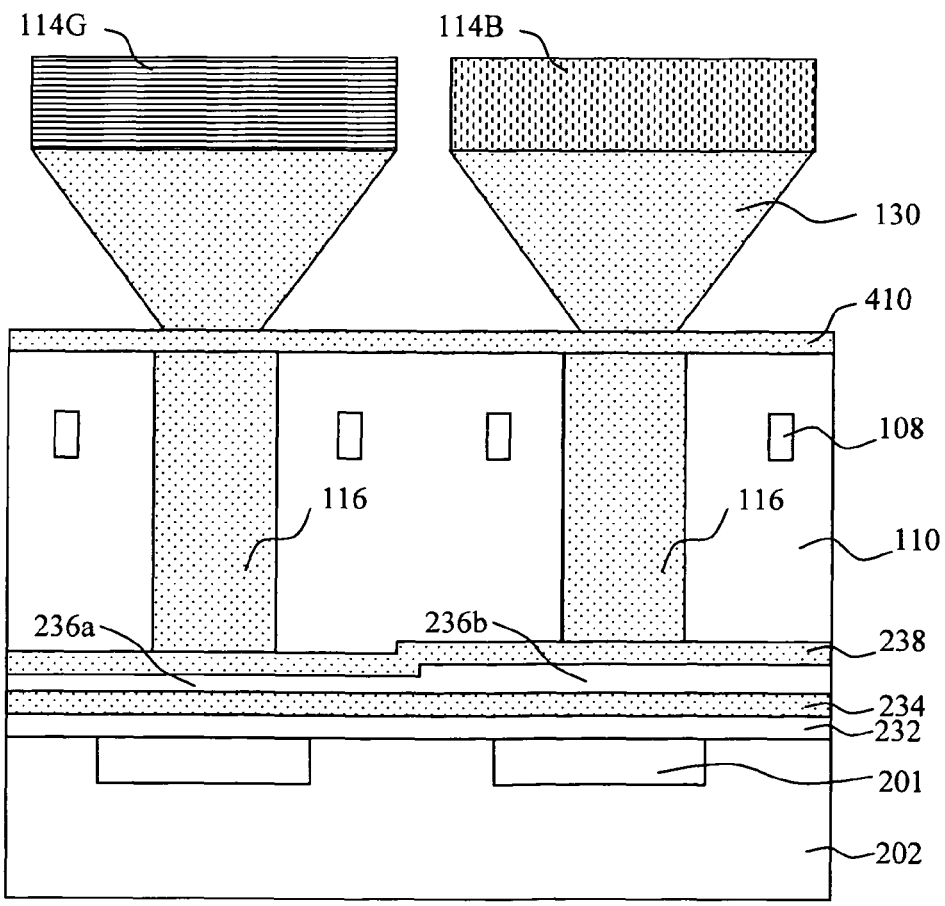
Figure 15A:
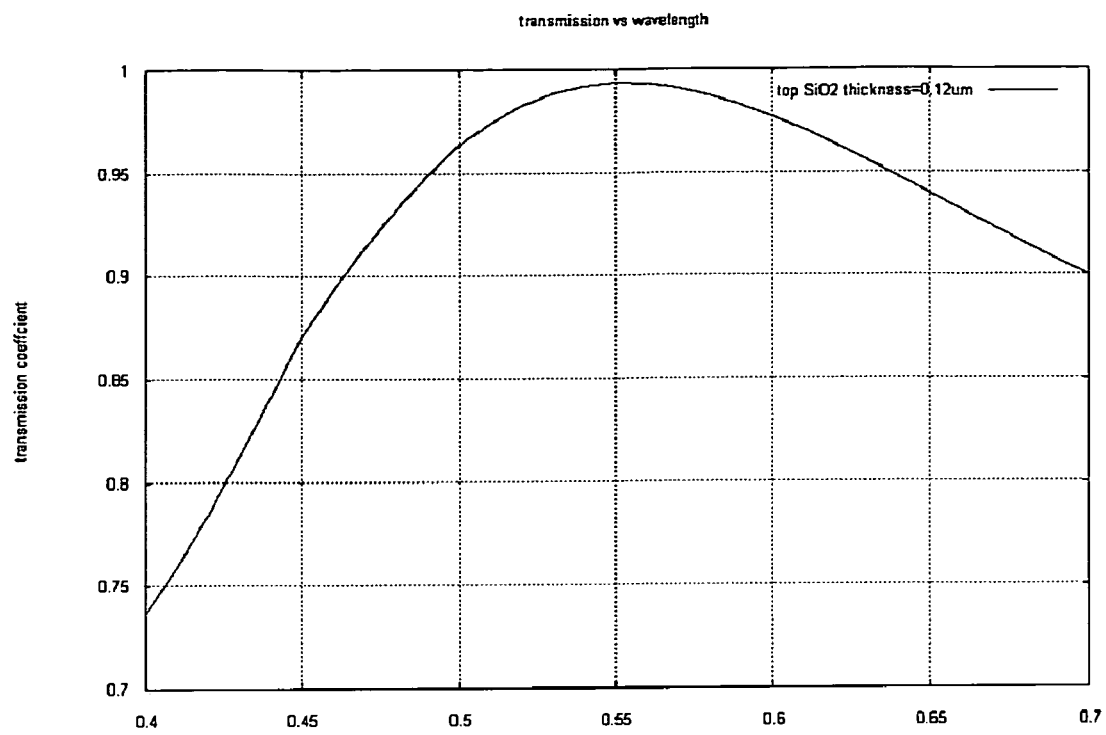
FIG. 15A is a graph of transmission coefficient versus light wavelength for a first anti-reflection layer on a left hand portion of FIG. 14G.

FIG. 15A is a graph of transmission coefficient versus light wavelength for the anti-reflection layers of FIG. 14G for a nominal thinner top AR film 236a of nominal thickness 0.12 um, a second AR film 234 of nominal thickness 500 Angstroms, and a third AR film 232 of nominal thickness 75 Angstroms. This graph peaks in the green color region at approximately 99%, and drops gently to approximately 93% at the center of the red color region. This graph shows that the top AR film 236a can be used at red pixels as well as green pixels.

Figure 15B:
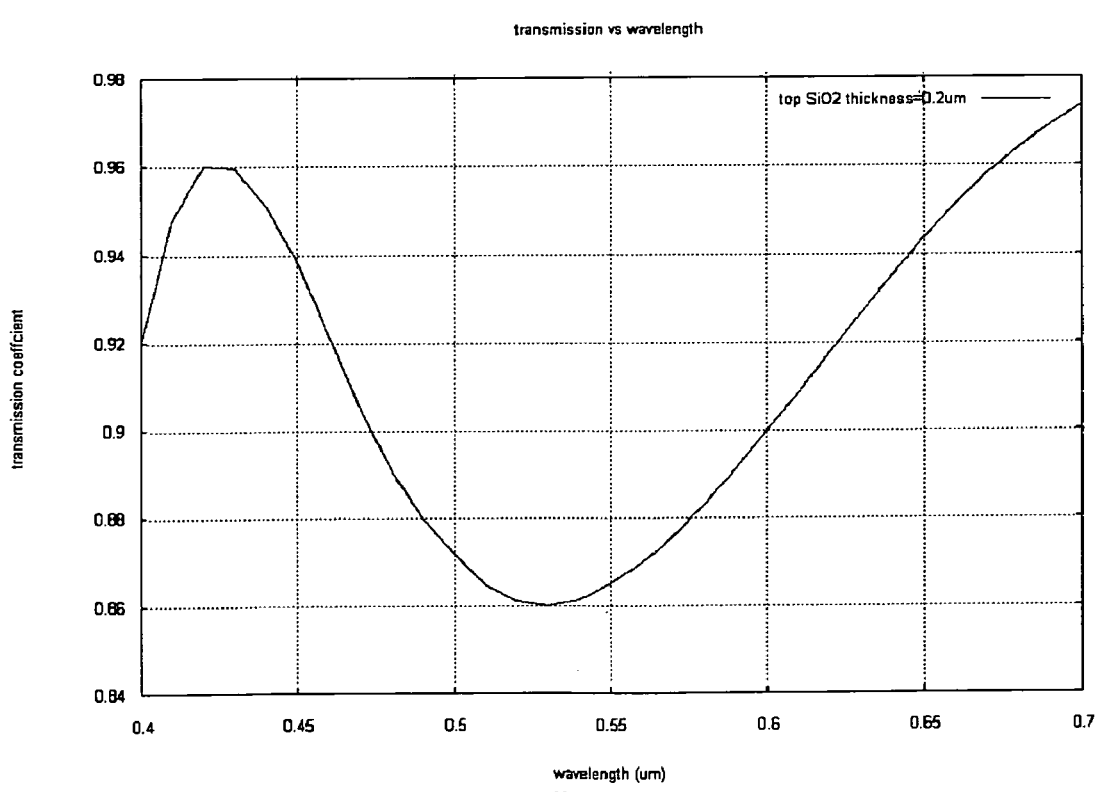
FIG. 15B is a graph of transmission coefficient versus light wavelength for a second anti-reflection layer shown on a right hand portion of FIG. 14G.

FIG. 15B is a graph of transmission coefficient versus light wavelength for the anti-reflection layer of FIG. 14G for a top AR film 236b of nominal thickness 0.20 um, a second AR film 234 of nominal thickness 500 Angstroms, and a third AR film 232 of nominal thickness 75 Angstroms. This graph peaks in two separate color regions, viz. purple and red. This graph shows that the top AR film 236b can be used at blue pixels and red pixels.

A pixel array can use top the AR film 236a for green pixels only while the top AR film 236b for both blue and red pixels. Alternately, the pixel array can use the top AR film 236a for both green and red pixels while the top AR film 236b is used for blue pixels only.

Another embodiment to provide two different AR layers that each optimizes for a different color region can be provided by creating different second AR film thicknesses while keeping the same top AR film thickness. Two different thicknesses are determined, one for each color region. The second AR film is first deposited to the larger thickness. Subsequently a lithography mask is applied to create a mask opening over the pixels that uses the smaller second AR film thickness. An etching step is applied to thin the second AR film under the mask opening to the smaller thickness. Subsequent steps are identical to FIGS. 12B-E.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of forming an image sensor, comprising:
    forming a plurality of photoelectric conversion units supported by a substrate;
    forming a support film adjacent to said plurality of photoelectric conversion units;
    forming a first opening and a second opening in said support film, each of said first and second openings being adjacent to a different one of said photoelectric conversion units and being mutually adjacent laterally;
    forming a first color filter in said first opening and a second color filter in said second opening, said first color filter being laterally adjacent to said second color filter;
    removing a first portion of said support film between said first and second color filters to form a gap, said gap having a width of 0.45 um or less.

2. The method of claim 1, wherein said gap has a depth of at least a wavelength in air of a visible light.

3. The method of claim 2, wherein said wavelength in air is 650 nm.

4. The method of claim 1, further comprising:
    forming a light guide in said first opening before said forming of said first color filter.

5. The method of claim 4, wherein said light guide comprises a material having a higher refractive index than said support film.

6. The method of claim 4, wherein said light guide comprises a silicon nitride.

7. The method of claim 4, wherein no microlens is formed adjacent to said first color filter and on a side of said light guide away from said corresponding one of said photoelectric conversion units.

8. The method of claim 4, wherein no microlens is formed to transmit a light through said first color filter to a corresponding one of said photoelectric conversion units.

9. The method of claim 1, further comprising:
    forming a pair of light guides each in a different one of said first and second openings and before said forming of said first and second color filters; and,
    removing a second portion of said support film under said first portion, said second portion being located between said pair of light guides.

10. The method of claim 1, wherein no microlens is formed to transmit a light through said first color filter to a corresponding one of said photoelectric conversion units.

11. The method of claim 1, further comprising:
    etching a layer of color filter above said first portion.

12. The method of claim 1, wherein said gap has a depth of at least 600 nm.

* * * * *

UNITED STATES PATENT AND TRADEMARK OFFICE
CERTIFICATE OF CORRECTION

| | | |
|---|---|---|
| PATENT NO. | : 7,816,641 B2 | Page 1 of 1 |
| APPLICATION NO. | : 12/218749 | |
| DATED | : October 19, 2010 | |
| INVENTOR(S) | : Hiok-Nam Tay and Thanh-Trung Do | |

It is certified that error appears in the above-identified patent and that said Letters Patent is hereby corrected as shown below:

Title Page, item (73);

On the front page, in the line of assignee and after "Candela Microsystems (S) Pte. Ltd." please insert -- (part interest) --.

Signed and Sealed this
Fourth Day of October, 2011

David J. Kappos
*Director of the United States Patent and Trademark Office*